(12) United States Patent
Song et al.

(10) Patent No.: US 11,437,379 B2
(45) Date of Patent: Sep. 6, 2022

(54) FIELD-EFFECT TRANSISTORS (FET) CIRCUITS EMPLOYING TOPSIDE AND BACKSIDE CONTACTS FOR TOPSIDE AND BACKSIDE ROUTING OF FET POWER AND LOGIC SIGNALS, AND RELATED COMPLEMENTARY METAL OXIDE SEMICONDUCTOR (CMOS) CIRCUITS

(71) Applicant: QUALCOMM Incorporated, San Diego, CA (US)

(72) Inventors: Stanley Seungchul Song, San Diego, CA (US); Deepak Sharma, Bangalore (IN); Bharani Chava, Cork (BE); Hyeokjin Lim, San Diego, CA (US); Peijie Feng, San Diego, CA (US); Seung Hyuk Kang, San Diego, CA (US); Jonghae Kim, San Diego, CA (US); Periannan Chidambaram, San Diego, CA (US); Kern Rim, San Diego, CA (US); Giridhar Nallapati, San Diego, CA (US); Venugopal Boynapalli, San Diego, CA (US); Foua Vang, Sacramento, CA (US)

(73) Assignee: QUALCOMM Incorporated, San Diego, CA (US)

( * ) Notice: Subject to any disclaimer, the term of this patent is extended or adjusted under 35 U.S.C. 154(b) by 46 days.

(21) Appl. No.: 17/025,211

(22) Filed: Sep. 18, 2020

(65) Prior Publication Data
US 2022/0093594 A1     Mar. 24, 2022

(51) Int. Cl.
*H01L 21/336*     (2006.01)
*H01L 29/66*     (2006.01)
(Continued)

(52) U.S. Cl.
CPC ........ *H01L 27/095* (2013.01); *H01L 23/5286* (2013.01); *H01L 29/7851* (2013.01);
(Continued)

(58) Field of Classification Search
CPC .......... H01L 21/4853; H01L 23/49827; H01L 25/50
(Continued)

(56) References Cited

U.S. PATENT DOCUMENTS 9,209,305 B1    12/2015  Zhang et al.
9,318,552 B2 *  4/2016   Xie .................. H01L 29/42376
(Continued)

OTHER PUBLICATIONS

International Search Report and Written Opinion for International Patent Application No. PCT/US2021/043954, dated Nov. 5, 2021, 13 pages.

*Primary Examiner* — Calvin Lee
(74) *Attorney, Agent, or Firm* — Qualcomm Incorporated

(57) ABSTRACT

Field-effect transistor (FET) circuits employing topside and backside contacts for topside and backside routing of FET power and logic signals. A FET circuit is provided that includes a FET that includes a conduction channel, a source, a drain, and a gate. The FET circuit also includes a topside metal contact electrically coupled with at least one of the source, drain, and gate of the FET. The FET circuit also includes a backside metal contact electrically coupled with at least one of the source, drain, and gate of the FET. The FET circuit also includes topside and backside metal lines electrically coupled to the respective topside and backside metal contacts to provide power and signal routing to the FET. A complementary metal oxide semiconductor (CMOS) circuit is also provided that includes a PFET and NFET that each includes a topside and backside contact for power and signal routing.

21 Claims, 14 Drawing Sheets

(51) Int. Cl.
  *H01L 27/095* (2006.01)
  *H01L 23/528* (2006.01)
  *H01L 29/78* (2006.01)
  *H03K 19/0185* (2006.01)

(52) U.S. Cl.
  CPC ............. *H03K 19/018521* (2013.01); *H01L 2029/7858* (2013.01)

(58) Field of Classification Search
  USPC ............. 257/343; 438/157, 176, 195, 282
  See application file for complete search history.

(56) References Cited

U.S. PATENT DOCUMENTS

| | | | |
|---|---|---|---|
| 10,186,484 B2 | 1/2019 | Nelson et al. | |
| 10,319,836 B1 * | 6/2019 | Reznicek | H01L 29/7827 |
| 10,325,840 B2 | 6/2019 | Nelson et al. | |
| 10,439,565 B2 | 10/2019 | Goktepeli | |
| 10,607,938 B1 | 3/2020 | Rubin et al. | |
| 10,692,873 B2 * | 6/2020 | Ando | H01L 21/823821 |
| 11,164,787 B2 * | 11/2021 | Reznicek | H01L 21/823418 |
| 11,270,991 B1 * | 3/2022 | Chava | H01L 21/4853 |
| 11,296,083 B2 * | 4/2022 | Lu | H01L 29/41725 |
| 11,302,813 B2 * | 4/2022 | Reznicek | H01L 29/401 |
| 2007/0296002 A1 | 12/2007 | Liang et al. | |
| 2014/0367753 A1 | 12/2014 | Huang et al. | |
| 2015/0069520 A1 | 3/2015 | Lee | |
| 2018/0061766 A1 | 3/2018 | Goktepeli | |
| 2019/0164882 A1 | 5/2019 | Chen et al. | |
| 2019/0172828 A1 | 6/2019 | Smith et al. | |
| 2019/0259699 A1 | 8/2019 | Morrow et al. | |
| 2019/0378790 A1 | 12/2019 | Bohr et al. | |
| 2020/0105889 A1 | 4/2020 | Liaw | |
| 2022/0102266 A1 | 3/2022 | Lim et al. | |

* cited by examiner

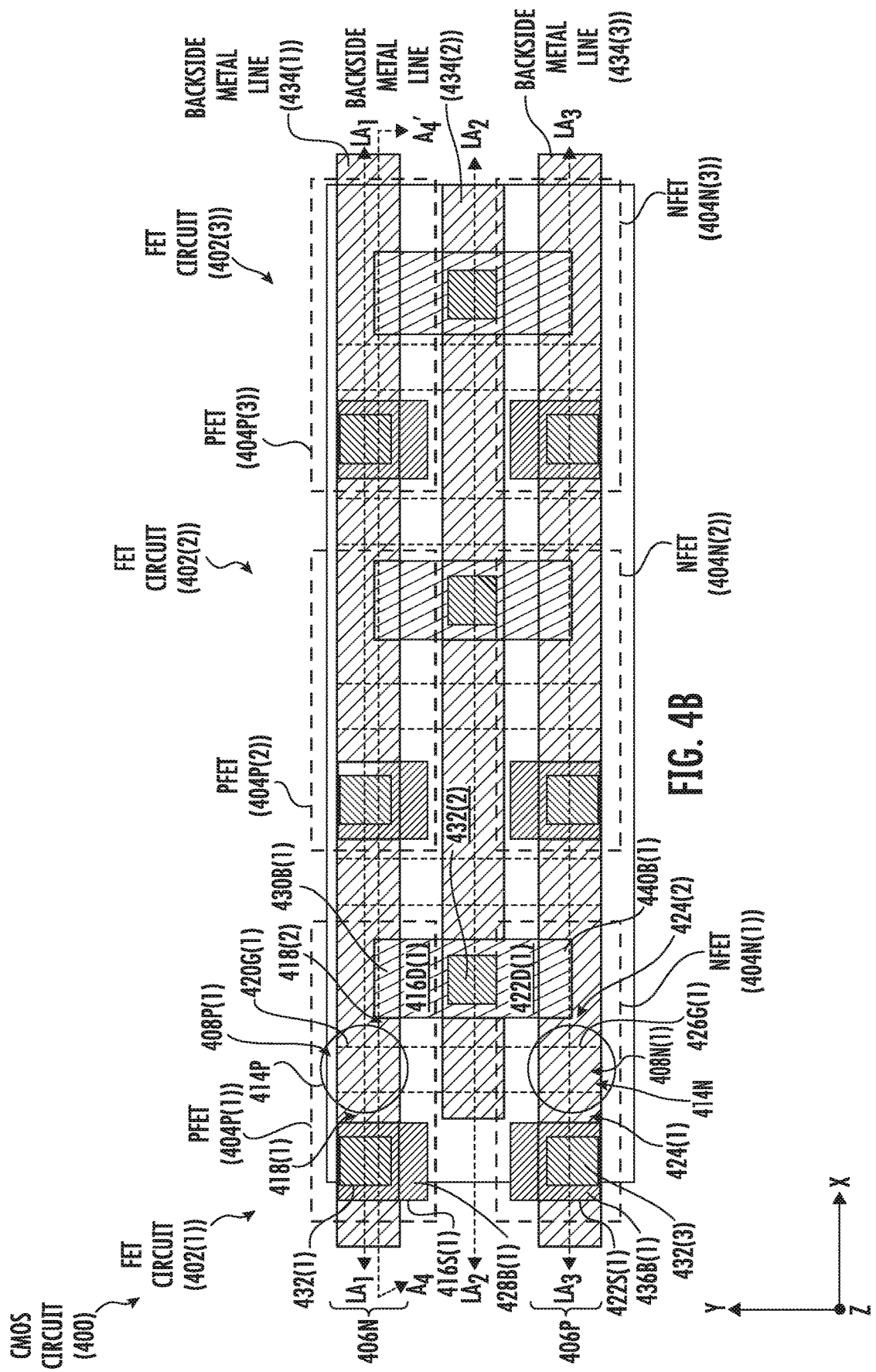

FIELD-EFFECT TRANSISTORS (FET) CIRCUITS EMPLOYING TOPSIDE AND BACKSIDE CONTACTS FOR TOPSIDE AND BACKSIDE ROUTING OF FET POWER AND LOGIC SIGNALS, AND RELATED COMPLEMENTARY METAL OXIDE SEMICONDUCTOR (CMOS) CIRCUITS

BACKGROUND

I. Field of the Disclosure

The field of the disclosure relates to field-effect transistors (FETs) and complementary metal oxide semiconductor (CMOS) integrated circuits employing P-type FETs (PFETs) and N-type FETs (NFETs) for forming logic circuits.

II. Background

Transistors are essential components in modern electronic devices. Large numbers of transistors are employed in integrated circuits (ICs) in many modern electronic devices. For example, components such as central processing units (CPUs), digital signal processors (DSPs), and memory systems each employ a large quantity of transistors for logic circuits and memory devices.

One type of transistor is a Field-Effect transistor (FET). A FET uses an electric field to control the flow of current between a source and a drain. The flow of current is controlled by application of a voltage to a gate of the FET, which in turn alters the conductivity between the source and the drain. Different types of FETs include planar FETs, Fin FETs (FinFETs), and gate-all-around (GAA) FETs. In integrated circuits (ICs) that employ a FET, the IC includes a source, a drain, and gate metal contacts that are formed in contact with the respective source, drain, and gate of the FET to provide signal routing to the FET. The metal contacts are then connected to a metal line in an interconnect layer of the IC that is above the semiconductor or active layer of the IC that includes the FET for routing signals to the source, drain, and gate of the FET through the source, drain, and gate metal contacts. For example, if a circuit employing the FET requires a power signal to be coupled to the source of the FET, the source contact is connected to a metal line that is designed to carry power. As another example, if a circuit employing the FET requires a logic signal to be coupled to the drain of the FET, the drain contact is connected to a metal line that is designed to carry the logic signal.

As the node size of circuits employing FETs is reduced in ICs to conserve area and/or to allow for more FETs to be fabricated in a given area or chip size, the gate pitch between adjacent FETs may also be decreased. This can decrease the distance between the source and the drain of adjacent FETs in an IC, increasing routing congestion in the interconnect layers disposed above the FETs for providing signal routing. Increased signal routing congestion can cause metal lines in the interconnect layers to be disposed closer together, thus increasing parasitic capacitance of the routing lines and thus increasing capacitance of the FETs. Increased capacitance on the FETs can reduce performance of the FETs.

SUMMARY OF THE DISCLOSURE

Aspects disclosed herein include field-effect transistor (FET) circuits employing topside and backside contacts for topside and backside routing of FET power and logic signals. Related complementary metal oxide semiconductor (CMOS) circuits that employ the FETs employing topside and backside contacts for topside and backside routing of FET power and logic signals are also disclosed. In this regard, in certain exemplary aspects disclosed herein, a FET circuit is provided that includes a FET that includes a conduction channel, a source, a drain, and a gate. The conduction channel is disposed above a substrate. The source is disposed in a first end portion of the conduction channel. The drain is disposed in a second end portion of the conduction channel. The gate is disposed above at least a portion of the conduction channel and between the first end portion and the second end portion of the conduction channel. The FET circuit also includes at least one topside metal contact in contact with at least one top surface of the source, the drain, and the gate of the FET. The FET circuit also includes at least one backside metal contact in contact with at least one bottom surface of the source, the drain, and the gate of the FET. The FET circuit also includes topside and backside metal lines that are electrically coupled to the respective topside and backside metal contacts to provide power and signal routing to the FET. At least one of the topside and backside metal lines is electrically coupled to a power rail configured to carry a power signal, and at least one of the other topside and backside metal lines is electrically coupled to a signaling metal line configured to carry logic signals.

In this manner, backside routing on the FET circuit provides additional area for signal and/or power routing that may be advantageously employed to offset any reduction in routing area as an example, such as due to reduction of FET size and/or the increased complexity of circuits that include the FET circuit. Increased signal routing congestion can cause metal lines in the interconnect layers to be disposed closer together, thus increasing parasitic capacitance of the routing lines and thus increasing capacitance of the FETs. Increased capacitance on the FETs can reduce performance of the FETs.

In another exemplary aspect, a CMOS circuit is provided that includes a substrate including a top surface, a positive (P)-type diffusion region disposed in the substrate, and a negative (N)-type diffusion region disposed in the substrate. The CMOS circuit includes a first power rail disposed adjacent to the P-type diffusion region and a second power rail disposed adjacent to the N-type diffusion region. At least one P-type FET (PFET) is formed in the N-type diffusion region, and at least one N-type FET (NFET) is formed in the P-type diffusion region. The PFETs and NFETs in the CMOS circuit each include a conduction channel disposed above the substrate, a source disposed in a first end portion of its conduction channel, a drain disposed in a second end portion of its conduction channel, and a gate disposed adjacent to its conduction channel. At least one PFET and at least one NFET in the CMOS circuit each include a source backside metal contact disposed below the top surface of the substrate and electrically coupled with a bottom surface of its source and a drain backside metal contact disposed below the top surface of the substrate and electrically coupled with a bottom surface of its drain. One of the source backside metal contact and drain backside metal contact of the at least one PFET and the at least one NFET is electrically coupled to a backside power metal line that extends in a longitudinal axis parallel to a longitudinal axis of a power rail among the first and second power rails and that is coupled to the power rail. The other one of the source backside metal contact and drain backside metal contact of the at least one PFET and the at least one NFET is electrically coupled a backside signaling metal line configured to carry logic signals.

In another exemplary aspect of the CMOS circuit, the backside signaling metal line extends along a longitudinal axis parallel to the longitudinal axis of the backside power metal line. The backside signaling metal line and the backside power metal line are disposed between the first and second power rails.

In this regard, in one exemplary aspect, a field-effect transistor (FET) circuit is provided. The FET circuit includes a signaling metal line configured to carry logic signals, a power rail configured to carry a power signal from a power source, and a FET. The FET circuit further includes a conduction channel disposed above a substrate, and a source disposed in a first end portion of the conduction channel, wherein the source includes a source top surface and a source bottom surface. The FET circuit also includes a drain disposed in a second end portion of the conduction channel opposite the first end portion, wherein the drain includes a drain top surface and a drain bottom surface. The FET circuit also includes a gate disposed above at least a portion of the conduction channel and between the first end portion and the second end portion of the conduction channel, wherein the gate includes a gate top surface and a gate bottom surface. The FET circuit also further includes a topside metal contact in contact with one of the source top surface, the drain top surface, and the gate top surface. The FET further includes a backside metal contact in contact with one of the source bottom surface, the drain bottom surface, and the gate bottom surface, and a topside metal line disposed above the gate. The topside metal line is electrically coupled to the topside metal contact and one of the signaling metal line and the power rail. The FET circuit also includes a backside metal line disposed below the conduction channel, wherein the backside metal line is electrically coupled to the backside metal contact and one of the power rail and the signaling metal line not coupled to the topside metal line.

In a further exemplary aspect, the backside metal contact of the FET includes a vertical interconnect access (via) in contact with the one of the source bottom surface, the drain bottom surface, and the gate bottom surface.

In a further exemplary aspect, the FET includes a second backside metal contact in contact with one of the source bottom surface, the drain bottom surface, and the gate bottom surface not in contact with the backside metal contact. A second backside metal line is disposed below the conduction channel, the second backside metal line electrically coupled to the second backside metal contact and the signaling metal line. In this further exemplary aspect, the backside metal contact is in contact with the source bottom surface, and the second backside metal contact is in contact with the drain bottom surface. In another exemplary aspect in this further aspect, the backside metal contact is in contact with the drain bottom surface, and the second backside metal contact is in contact with the source bottom surface. In another exemplary aspect in this further aspect, the conduction channel extends along a first longitudinal axis between the first end portion and the second end portion of the conduction channel, the backside metal line extends along a second longitudinal axis parallel to the first longitudinal axis, and the second backside metal line extends along a third longitudinal axis parallel to the second longitudinal axis.

In a further exemplary aspect, the FET further includes the substrate including a substrate top surface and a substrate bottom surface, and a buried oxide (BOX) layer disposed on the substrate top surface, wherein the backside metal line is disposed below the substrate bottom surface, the source is disposed in contact with the BOX layer, and the drain is disposed in contact with the BOX layer. In this further aspect, in an exemplary aspect, the source extends through the BOX layer such that the source bottom surface is in contact with the substrate top surface and/or the drain extends through the BOX layer such that the drain bottom surface is in contact with the substrate top surface. In another exemplary aspect in this further aspect, the backside metal contact includes a via including a via top surface in contact with the one of the source bottom surface, the drain bottom surface, and the gate bottom surface.

In another exemplary aspect, the backside metal contact includes a via including a via top surface in contact with the one of the source bottom surface, the drain bottom surface, and the gate bottom surface. In this further aspect, in another exemplary aspect, the via is in contact with the substrate.

In another exemplary aspect, the backside metal contact includes a backside metal contact top surface in contact with the one of the source bottom surface, the drain bottom surface, and the gate bottom surface. The backside metal contact further includes a backside metal contact bottom surface and a via including a via top surface in contact with the backside metal contact bottom surface. In another exemplary aspect in this further aspect, the backside metal contact is in contact with a buried oxide (BOX) layer, and the via is in contact with the substrate. In another exemplary aspect in this further aspect, the one of the source bottom surface, the drain bottom surface, and the gate bottom surface in contact with the backside metal contact top surface of the backside metal contact is in contact with a BOX layer top surface of the BOX layer.

In another exemplary aspect, a method of fabricating a FET circuit is provided, the method including forming a FET, including forming a conduction channel above a substrate, forming a source disposed in a first end portion of the conduction channel, the source including a source top surface and a source bottom surface, forming a drain disposed in a second end portion of the conduction channel opposite the first end portion, the drain including a drain top surface and a drain bottom surface, and forming a gate disposed above at least a portion of the conduction channel and between the first end portion and the second end portion of the conduction channel, the gate including a gate top surface and a gate bottom surface. The method further includes forming a topside metal contact in contact with one of the source top surface, the drain top surface, and the gate top surface, forming a backside metal contact in contact with one of the source bottom surface, the drain bottom surface, and the gate bottom surface, and forming a topside metal line disposed above the gate and in electrical contact with the topside metal contact. The method further includes forming a backside metal line disposed below the conduction channel and in electrical contact with the backside metal contact. The method further includes forming a signaling metal line configured to carry logic signals in contact with one of the topside metal line and the backside metal line. The method further includes forming a power rail configured to carry a power signal from a power source in contact with one of the backside metal line and the topside metal line not in contact with the signaling metal line.

In another exemplary aspect of this method, forming the backside metal contact includes forming a via including a via top surface in contact with the one of the source bottom surface, the drain bottom surface, and the gate bottom surface.

Another exemplary aspect of the method further includes forming the substrate including a substrate top surface and a substrate bottom surface, and forming a buried oxide (BOX) layer on the substrate top surface, wherein forming the backside metal line further includes forming the backside metal line below the substrate bottom surface, wherein forming the source further includes forming the source in contact with the BOX layer, and wherein forming the drain further includes forming the drain in contact with the BOX layer. In this further aspect, in another exemplary aspect, the method includes forming the source by forming the source to extend through the BOX layer such that the source bottom surface is in contact with the substrate top surface. In this further aspect, in another exemplary aspect, forming the drain further includes forming the drain to extend through the BOX layer such that the drain bottom surface is in contact with the substrate top surface.

In another exemplary aspect of the method, forming the backside metal contact further includes forming a backside metal contact top surface in contact with the one of the source bottom surface, the drain bottom surface, and the gate bottom surface. The method further includes forming a backside metal contact bottom surface and forming a via including a via top surface in contact with the backside metal contact bottom surface.

In another exemplary aspect, a complementary metal-oxide semiconductor (CMOS) circuit is provided. The CMOS circuit includes a P-type diffusion region disposed in a substrate, an N-type diffusion region disposed in the substrate, a power rail having a first longitudinal axis disposed in a first direction, a signaling metal line electrically coupled to another circuit, and a P-type field-effect transistor (FET) (PFET) formed in the N-type diffusion region. The PFET includes a P-type conduction channel, a P-type source disposed in a first end portion of the P-type conduction channel, a P-type drain disposed in a second end portion of the P-type conduction channel opposite the first end portion, and a first gate disposed above at least a portion of the P-type conduction channel and between the first end portion and the second end portion of the P-type conduction channel. The CMOS circuit further includes an N-type field-effect transistor (NFET) formed in the P-type-diffusion region. The NFET includes an N-type conduction channel, an N-type source disposed in a first end portion of the N-type conduction channel, an N-type drain disposed in a second end portion of the N-type conduction channel opposite the first end portion, and a second gate disposed above at least a portion of the N-type conduction channel and between the first end portion and the second end portion of the N-type conduction channel. The CMOS circuit further includes a first backside metal contact in contact with one of the P-type source, the P-type drain, and the first gate; a second backside metal contact in contact with one of the N-type source, the N-type drain, and the second gate. The CMOS circuit further includes a first backside metal line disposed below the substrate, the first backside metal line electrically coupled to the first backside metal contact. The CMOS circuit further includes a second backside metal line disposed below the substrate. The second backside metal line is electrically coupled to the second backside metal contact. The first backside metal line is coupled to one of the power rail and the signaling metal line. The second backside metal line is coupled to one of the signaling metal line and the power rail not coupled to the first backside metal line.

In another exemplary aspect of the CMOS circuit, the P-type source includes a P-type source top surface and a P-type source bottom surface, the P-type drain includes a P-type drain top surface and a P-type drain bottom surface, the first gate includes a first gate top surface and a first gate bottom surface, the N-type source includes an N-type source top surface and an N-type source bottom surface, the N-type drain includes an N-type drain top surface and an N-type drain bottom surface, the second gate includes a second gate top surface and a second gate bottom surface, the first backside metal contact is in contact with one of the P-type source bottom surface, the P-type drain bottom surface, and the first gate bottom surface, and the second backside metal contact is in contact with one of the N-type source bottom surface, the N-type drain bottom surface, and the second gate bottom surface.

In another exemplary aspect of the CMOS circuit, the first backside metal line is coupled to the power rail, and the second backside metal line is coupled to the signaling metal line.

In another exemplary aspect of the CMOS circuit, the first backside metal line is coupled to the signaling metal line, and the second backside metal line is coupled to the power rail.

In another exemplary aspect of the CMOS circuit, the CMOS circuit further includes a second signaling metal line electrically coupled to another circuit, a topside metal contact in contact with one of the P-type source, the P-type drain, and the first gate, and a topside metal line disposed above the first gate, the topside metal line electrically coupled to the topside metal contact and the second signaling metal line.

In another exemplary aspect of the CMOS circuit, the CMOS circuit further includes a second signaling metal line electrically coupled to another circuit, a topside metal contact in contact with one of the N-type source, the N-type drain, and the second gate, and a topside metal line disposed above the second gate, the topside metal line electrically coupled to the topside metal contact and the second signaling metal line.

In another exemplary aspect of the CMOS circuit, the CMOS circuit further includes a second power rail having a second longitudinal axis parallel to the first longitudinal axis, a third backside metal contact in contact with one of the N-type source, the N-type drain, and the second gate, and a third backside metal line disposed below the substrate, the third backside metal line electrically coupled to the second power rail. In this further aspect, another exemplary aspect includes the power rail disposed adjacent to the N-type diffusion region, the second power rail disposed adjacent to the P-type diffusion region, the first backside metal contact in contact with the P-type source, the second backside metal contact in contact with the N-type drain, the third backside metal contact in contact with the N-type source, the first backside metal line coupled to the power rail, the second backside metal line coupled to the signaling metal line, the third backside metal line coupled to the second power rail, and the signaling metal line disposed between the first power rail and the second power rail. In this further exemplary aspect, another exemplary aspect includes the second backside metal contact including a second backside metal contact top surface in contact with the N-type drain bottom surface and a second backside metal contact bottom surface, and a via including a via top surface in contact with the second backside metal contact bottom surface.

In another exemplary aspect of the CMOS circuit, the first backside metal contact includes a vertical interconnect access (via) in contact with the one of the P-type source, the P-type drain, and the first gate, and the second backside metal contact includes a second via in contact with the one of the N-type source, the N-type drain, and the second gate.

In another exemplary aspect of the CMOS circuit, the CMOS circuit further includes the substrate including a substrate top surface and a substrate bottom surface, a buried oxide (BOX) layer disposed on the substrate top surface wherein the first backside metal line is disposed below the substrate bottom surface, the second backside metal line is disposed below the substrate bottom surface, the P-type source is disposed in contact with the BOX layer, the P-type drain is disposed in contact with the BOX layer, the N-type source is disposed in contact with the BOX layer, and the N-type drain is disposed in contact with the BOX layer. In this further exemplary aspect, in another exemplary aspect, at least one of the P-type source extends through the BOX layer such that the P-type source bottom surface is in contact with the substrate top surface, and the P-type drain extends through the BOX layer such that the P-type drain bottom surface is in contact with the substrate top surface, and at least one of the N-type source extends through the BOX layer such that the N-type source bottom surface is in contact with the substrate top surface, and the N-type drain extends through the BOX layer such that the N-type drain bottom surface is in contact with the substrate top surface. In this further exemplary aspect, in another exemplary aspect, the first backside metal contact includes a first via including a via top surface in contact with the one of the P-type source bottom surface, the P-type drain bottom surface, and the first gate bottom surface, and the second backside metal contact includes a second via including a second via top surface in contact with the one of the N-type source bottom surface, the N-type drain bottom surface, and the second gate bottom surface. In another further exemplary aspect in this exemplary aspect, the first via is in contact with the substrate, and the second via is in contact with the substrate.

In another exemplary aspect of the CMOS circuit, the first backside metal contact includes a first backside metal contact top surface in contact with the one of the P-type source bottom surface, the P-type drain bottom surface, and the first gate bottom surface. The first backside metal contact further includes a first backside metal contact bottom surface and a first via including a first via top surface in contact with the first backside metal contact bottom surface. The second backside metal contact further includes a second backside metal contact top surface in contact with the one of the N-type source bottom surface, the N-type drain bottom surface, and the second gate bottom surface, a second backside metal contact bottom surface, and a second via including a second via top surface in contact with the second backside metal contact bottom surface. In this further exemplary aspect, in another exemplary aspect, the first backside metal contact is in contact with a buried oxide (BOX) layer, the first via is in contact with the substrate, the second backside metal contact is in contact with the BOX layer, and the second via is in contact with the substrate. In a further exemplary aspect in this exemplary aspect, the one of the P-type source bottom surface, the P-type drain bottom surface, and the first gate bottom surface in contact with the first backside metal contact top surface of the first backside metal contact is in contact with a BOX layer top surface of the BOX layer, and the one of the N-type source bottom surface, the N-type drain bottom surface, and the second gate bottom surface in contact with the second backside metal contact top surface of the second backside metal contact is in contact with the BOX layer top surface of the BOX layer.

BRIEF DESCRIPTION OF THE FIGURES

FIGS. 4A and 4B illustrate respective cross-sectional side and bottom views of an exemplary CMOS circuit that includes FET circuits that include a PFET and an NFET, wherein the FET circuits include the PFET and the NFET that each includes source backside metal contacts in contact with bottom surfaces of their respective sources electrically coupled to a respective power metal line, and wherein the FET circuits also include a drain backside metal contact electrically coupled with a bottom surface of a common drain extended through a buried oxide (BOX) layer and electrically coupled to a signaling metal line;

Figure 1A:
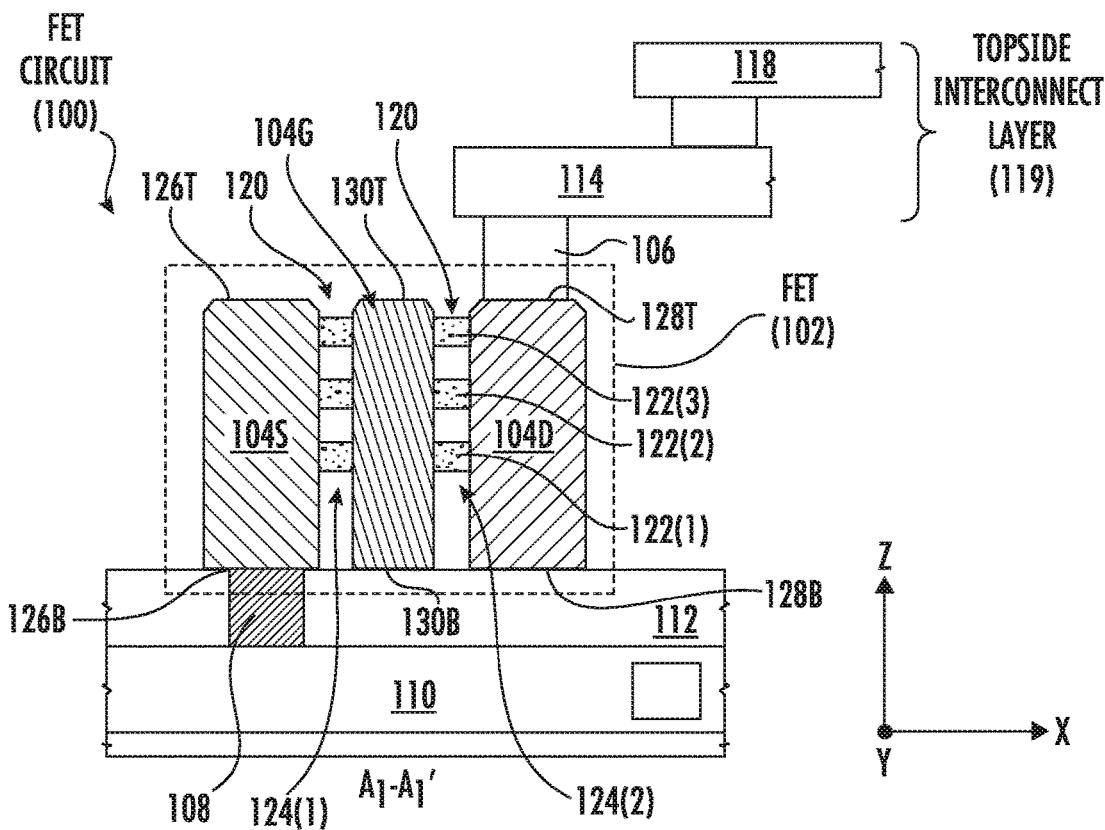
FIGS. 1A and 1B are respective cross-sectional side and bottom views of an exemplary field-effect transistor (FET) circuit that includes a FET having a gate, a source, and a drain, wherein the FET circuit further includes a topside metal contact in contact with the drain and electrically coupled to a topside metal line, and a backside metal contact in contact with the source and electrically coupled to a backside metal line.

components formed from FETs employing backside contacts for backside routing of power and/or logic signals to the FETs, including but not limited to the FETs in FIGS. 1A-1B, 2, 4A-4D, 5A-5B, and 6A-6B, and wherein the FETs may be included in CMOS circuits that include backside contacts for backside routing of power and logic signals to the FETs, including but not limited to the CMOS circuits in FIGS. 2, 4A-4D, 5A-5B, and 6A-6B.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include field-effect transistors (FET) circuits employing topside and backside contacts for topside and backside routing of FET power and logic signals. Related complementary metal oxide semiconductor (CMOS) circuits that employ the FETs employing topside and backside contacts for topside and backside routing of FET power and logic signals are also disclosed. In this regard, in certain exemplary aspects disclosed herein, a FET circuit is provided that includes a FET that includes a conduction channel, a source, a drain, and a gate. The conduction channel is disposed above a substrate. The source is disposed in a first end portion of the conduction channel. The drain is disposed in a second end portion of the conduction channel. The gate is disposed above at least a portion of the conduction channel and between the first end portion and the second end portion of the conduction channel. The FET circuit also includes at least one topside metal contact in contact with at least one top surface of the source, the drain, and the gate of the FET. The FET circuit also includes at least one backside metal contact in contact with at least one bottom surface of the source, the drain, and the gate of the FET. The FET circuit also includes topside and backside metal lines that are electrically coupled to the respective topside and backside metal contacts to provide power and signal routing to the FET. At least one of the topside and backside metal lines is electrical coupled to a power rail configured to carry a power signal, and at least one of the other topside and backside metal lines is electrically coupled to a signaling metal line configured to carry logic signals.

In this manner, backside routing on the FET circuit provides additional area for signal and/or power routing that may be advantageously employed to offset any reduction in routing area as an example, such as due to reduction of FET size and/or the increased complexity of circuits that include the FET circuit. Increased signal routing congestion can cause metal lines in the topside interconnect layers to be disposed closer together, thus increasing parasitic capacitance of the routing lines and thus increasing capacitance of the FETs. Increased capacitance on the FETs can reduce performance of the FETs.

Figure 1B:
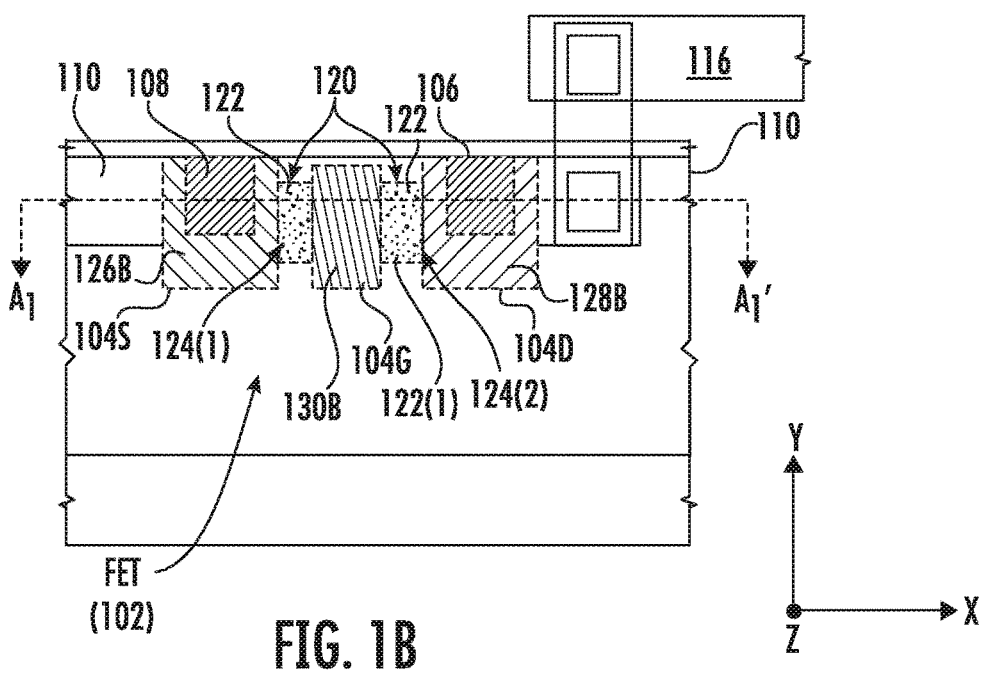

In this regard, FIGS. 1A and 1B are a respective cross-sectional side view and bottom view of an exemplary FET circuit 100 that includes a FET 102 with its drain 104D in contact with a topside metal contact 106 for topside routing and its source 104S in contact with a backside metal contact 108 for backside routing. FIG. 1A is a cross-sectional side view of the FET circuit 100 in FIG. 1B along the $A_1$-$A_1$' cross-section line. As shown in FIGS. 1A and 1B, the backside metal contact 108 is provided in the FET circuit 100 and in contact with a backside metal line 110 to allow routing of signals from the backside of the FET 102 beneath a substrate 112 in the Z-axis direction to the FET 102. In this example, the backside metal line 110 is below the substrate 112 in the Z-axis direction as shown in FIG. 1A. Similarly, as shown in FIG. 1A, the topside metal contact 106 is provided in the FET circuit 100 and in contact with a topside metal line 114 to allow routing of signals from the topside of the FET 102 above a gate 104G of the FET 102 in the Z-axis direction. For example, the backside metal line 110 could be electrically coupled to a power rail 116 that is configured to carry a power signal from a power source so that the backside metal line 110 receives and couples the power signal to the source 104S of the FET 102 through the backside metal contact 108. As another example, the topside metal line 114 could be electrically coupled to a signaling metal line 118 in an interconnect layer 119 above the FET 102 that is configured to carry a logic signal so as to couple the logic signal to the drain 104D of the FET 102 through the topside metal contact 106. In another example, the backside metal line 110 could be electrically coupled to a signaling metal line configured to carry a logic signal, and the topside metal line 114 could be electrically coupled to a power rail configured to carry a power signal from a power source.

In this manner, the backside routing to the FET 102 provides additional area for signal and/or power routing to the FET 102 that may be advantageously employed to offset any reduction in routing area in the FET circuit 100, such as due to reduction of FET node size and/or the increased complexity of circuits that include the FET circuit 100. Increased signal routing congestion can cause metal lines in the interconnect layers 119 of the FET circuit 100 to be disposed closer together, thus increasing parasitic capacitance of the routing lines and thus increasing capacitance of the FETs, including the FET 102. Increased capacitance on the FETs in the FET circuit 100 can reduce performance of the FETs.

The FET 102 in FIGS. 1A and 1B is a gate-all-around (GAA) FET in this example, but note that the FET 102 could be a planar FET or a FinFET as other non-limiting examples. A GAA FET is also known as a surrounding-gate transistor (SGT), and is similar in concept to a FinFET except that the gate material surrounds the channel region on all sides. A FinFET is a multigate device, a MOSFET (metal-oxide-semiconductor field-effect transistor) built on a substrate where the gate is placed on two, three, or more sides of the channel, forming a multigate structure. A planar FET includes a conduction channel formed in a substrate where a gate is placed above the conduction channel with an insulating material therebetween. The FET 102 includes a conduction channel 120 that is disposed above the substrate 112, which is a bulk substrate in this example, in the Z-axis direction. A plurality of nanostructures 122(1)-122(3) (e.g., nanowires or nanoslabs) is provided that may have been formed from the substrate 112 and are of a semiconductor material to be able to conduct current in response to an electric field. A bulk substrate is a free-standing substrate. The FET 102 includes the source 104S that is disposed in a first end portion 124(1) of the conduction channel 120. In this example, by the backside metal line 110 being below the substrate 112 in the Z-axis direction, the backside metal line 110 is also below the conduction channel 120 since the FET 102 in this example is a GAA FET where the conduction channel 120 is disposed above the substrate 112. If, for example, the FET circuit 100 included a planar FET where the conduction channel was disposed below a gate and in a substrate, a backside metal line could be below the conduction channel 120 of the planar FET, but may not be completely below the substrate.

The FET also includes the drain 104D that is disposed in a second end portion 124(2) of the conduction channel 120 opposite the first end portion 124(1) in the X-axis direction. The gate 104G is disposed above at least a portion of the conduction channel 120 between the first end portion 124(1) and the second end portion 124(2) of the conduction channel 120. In this example, the gate 104G is comprised of a gate material that surrounds each of the nanostructures 122(1)-122(3) of the conduction channel 120. In this manner, a voltage applied between the gate 104G and source 104S of the FET 102 can create an electric field in the conduction channel 120 sufficient to cause the nanostructures 122(1)-122(3) of the conduction channel 120 to conduct current between the source 104S and the drain 104D.

With continuing reference to FIG. 1A, in this example, the source 104S has a source top surface 126T and a source bottom surface 126B, and the drain 104D has a drain top surface 128T and a drain bottom surface 128B. For example, the source 104S and drain 104D may have been epitaxially grown on the substrate 112 or formed by an implant into the substrate 112. In this example, the topside metal contact 106 is in contact with the drain top surface 128T of the drain 104D of the FET 102 to provide connectivity between the drain 104D and the topside metal line 114. For example, the topside metal contact 106 may be a conductive pillar or vertical interconnect access (via) that connects the drain top surface 128T to the topside metal line 114. For example, the topside metal contact 106 may be a through-silicon-via (TSV) or other via that is of sufficiently small diameter to connect the drain top surface 128T to the topside metal line 114 without disturbing adjacent routing areas. Also in this example, the backside metal contact 108 is in contact with the source bottom surface 126B of the source 104S of the FET 102 to provide connectivity between the source 104S and the backside metal line 110. For example, the backside metal contact 108 may be a conductive pillar or via that connects the source bottom surface 126B to the backside metal line 110. For example, the backside metal contact 108 may be a TSV or other via that is of sufficiently small diameter to connect the source bottom surface 126B to the backside metal line 110 without disturbing adjacent routing areas.

Note that although the FET 102 in FIGS. 1A and 1B shows the source 104S connected to the backside metal line 110 for backside routing to the source 104S, and the drain 104D connected to the topside metal line 114 for topside routing to the drain 104D, such is not limiting. As another example, the drain 104D could be connected to the backside metal line 110 for backside routing to the drain 104D, and the source 104S could be connected to the topside metal line 114 for topside routing to the source 104S. Further, the source 104S and/or the drain 104D of the FET could be connected by both topside and backside routing if desired, for signal and/or power routing. Further, the gate 104G of the FET 102 could be connected to a topside metal contact and/or a backside metal contact to provide gate connectivity to a topside and/or backside metal line for signal and/or power routing. The gate 104G of the FET 102 includes a gate top surface 130T that could be connected to a topside metal contact and a gate bottom surface 130B that could be connected to a backside metal contact to provide topside and/or backside routing to the gate 104G.

Figure 2:
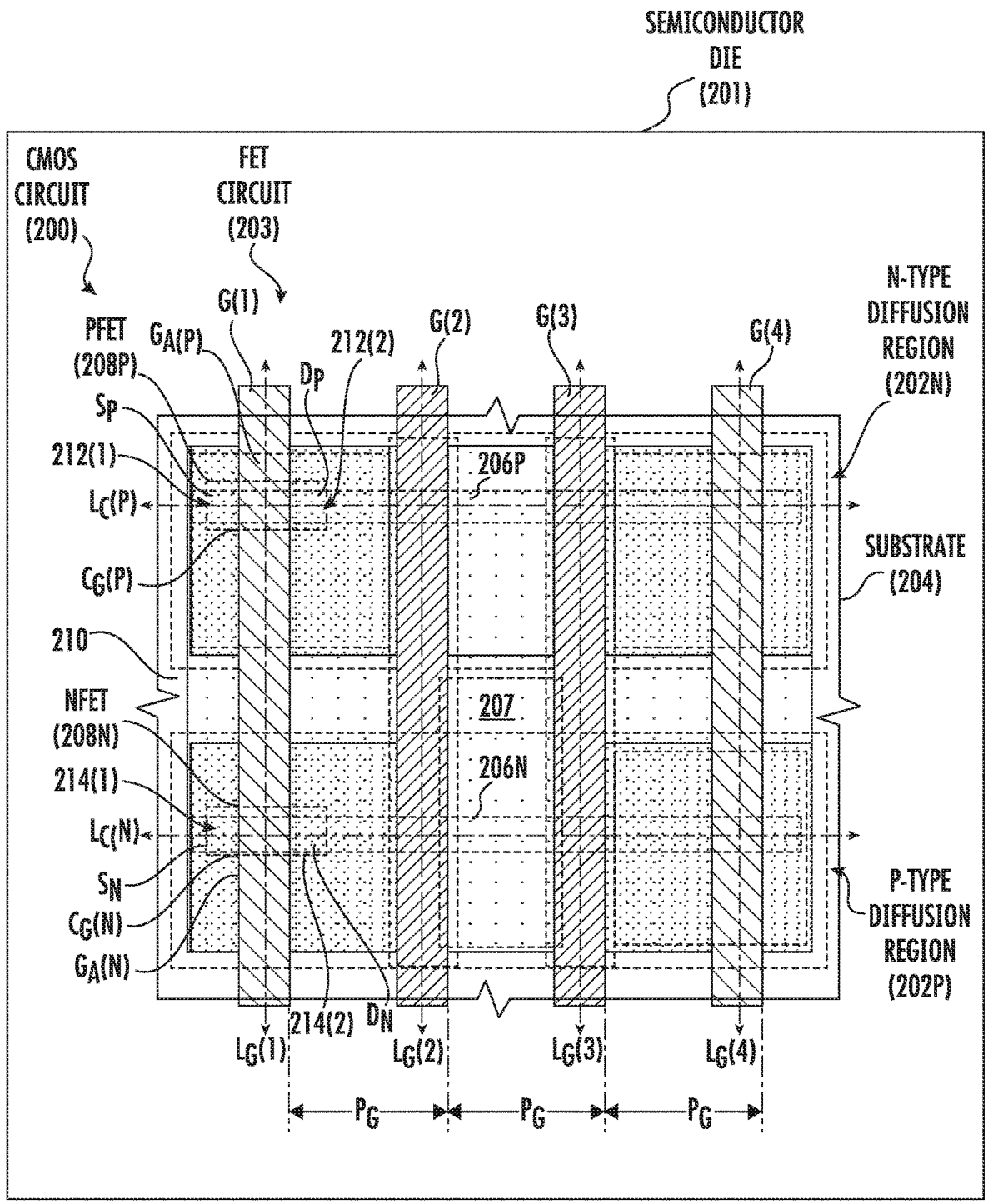
FIG. 2 is a top view of an exemplary complementary metal oxide semiconductor (CMOS) circuit that includes FET circuits like the FET circuit in FIGS. 1A and 1B that include backside metal contacts for power and/or signal routing to the FET circuits, wherein the FET circuits can include a positive (P)-type FET (PFET) and a negative (N)-type FET (NFET) for forming logic circuits.

FET circuits that include backside and/or topside metal contacts for backside and/or topside signal routing, like the FET circuit 100 in FIGS. 1A and 1B, can be provided in a complementary metal oxide semiconductor (CMOS) circuit to form logic circuits and gates, as an example. In this regard, FIG. 2 is a top view of an exemplary CMOS circuit 200 that can be included in a semiconductor die 201 and that includes a FET circuit 203 with FETs that can be like the FET circuit 100 and FET 102 in FIGS. 1A and 1B that includes one or more backside metal contacts for backside power and/or signal routing to the FET. The FETs can also include one or more topside metal contacts for topside power and/or signal routing to the FET. In this example, the CMOS circuit 200 includes a positive (P)-type diffusion region 202P in a semiconductor substrate 204 ("substrate 204") and a negative (N)-type diffusion region 202N formed in the substrate 204. For example, the P-type diffusion region 202P may be formed by doping a portion of the substrate 204 with an impurity material that is able to leave holes in the substrate 204. The N-type diffusion region 202N may be formed by doping a portion of the substrate 204 with an impurity material as a donor material that is able to give up free electrons in the substrate 204. PFETs can be formed in the CMOS circuit 200 by forming a P-type source and a P-type drain in the N-type diffusion region 202N. NFETs can be formed in the CMOS circuit 200 by forming an N-type source and an N-type drain in the P-type diffusion region 202P. A diffusion break 207 is provided between the P-type diffusion region 202P and N-type diffusion region 202N to provide electrical isolation.

As shown in FIG. 2, P-type and N-type conduction channels 206P, 206N are formed in the CMOS circuit 200 above the substrate 204 and extended along longitudinal axes $L_{C(P)}$, $L_{C(N)}$ in the X-axis direction. Gates G(1)-G(4) are formed in the CMOS circuit 200 along longitudinal axes $L_{G(1)}$-$L_{G(4)}$ in the Y-axis direction, orthogonal to the longitudinal axes $L_{C(P)}$, $L_{C(N)}$ of the P-type and N-type conduction channels 206P, 206N in the X-axis direction, and extend above and around at least a portion of the P-type and N-type conduction channels 206P, 206N. Gates G(1) and G(4) are active gates of a conductive material, such as metal (referred to herein as "active gates" G(1) or G(4)), and gates G(2) and G(3) are dummy gates of a dielectric material (referred to herein as "dummy gates" G(2) or G(3)). An active gate is a gate that forms part of a FET to control the electric field in the channel region when a sufficient voltage is applied to the gate. A dummy gate is a structure of a gate material that is not part of a FET, but put on the edge of a circuit cell to electrically isolate one circuit cell from an adjacent circuit cell.

As shown in FIG. 2, a PFET 208P (such as a GAA PFET) is formed in the N-type diffusion region 202N by forming a P-type source $S_P$ and a P-type drain $D_P$ on opposite sides of the active gate G(1) in the N-type diffusion region 202N. Similarly, as shown in FIG. 2, an NFET 208N, such as a GAA NFET, is formed in the P-type diffusion region 202P by forming an N-type source $S_N$ and an N-type drain $D_N$ on opposite sides of the active gate G(1) in the P-type diffusion region 202P.

With continuing reference to FIG. 2, the P-type and N-type conduction channels 206P, 206N are disposed on a top surface 210 of the substrate 204 in this example. The gates G(1)-G(4) are located adjacent to each other and have a gate pitch $P_G$ according to the layout of a circuit cell. For example, active gate G(1) is located adjacent to dummy gate G(2). Dummy gate G(2) is disposed between and adjacent to active gate G(1) and dummy gate G(3). In this example, the active gates G(1), G(4) extend around at least a portion of the P-type and N-type conduction channels 206P, 206N to form FETs, such as FinFETs or Gate-All-Around (GAA) FETs, as examples. As shown in FIG. 2, a gate contact $C_{G(P)}$ is formed over a portion of the active gate G(1) to form an active gate $G_{A(P)}$ for the PFET 208P. Similarly, a gate contact $C_{G(N)}$ is formed over a portion of the active gate G(1) to form an active gate $G_{A(N)}$ for the NFET 208N. The P-type source $S_P$ and P-type drain $D_P$ of the PFET 208P are formed in first and second end portions 212(1), 212(2) of the P-type conduction channel 206P on opposite sides of the active gate G(1) where the gate contact $C_{G(P)}$ is formed over the active gate G(1). The N-type source $S_N$ and N-type drain $D_N$ of the NFET 208N are formed in first and second end portions 214(1), 214(2) of the N-type conduction channel 206N on opposite sides of the active gate G(1) where the gate contact $C_{G(N)}$ is formed over the active gate G(1).

Figure 3A:
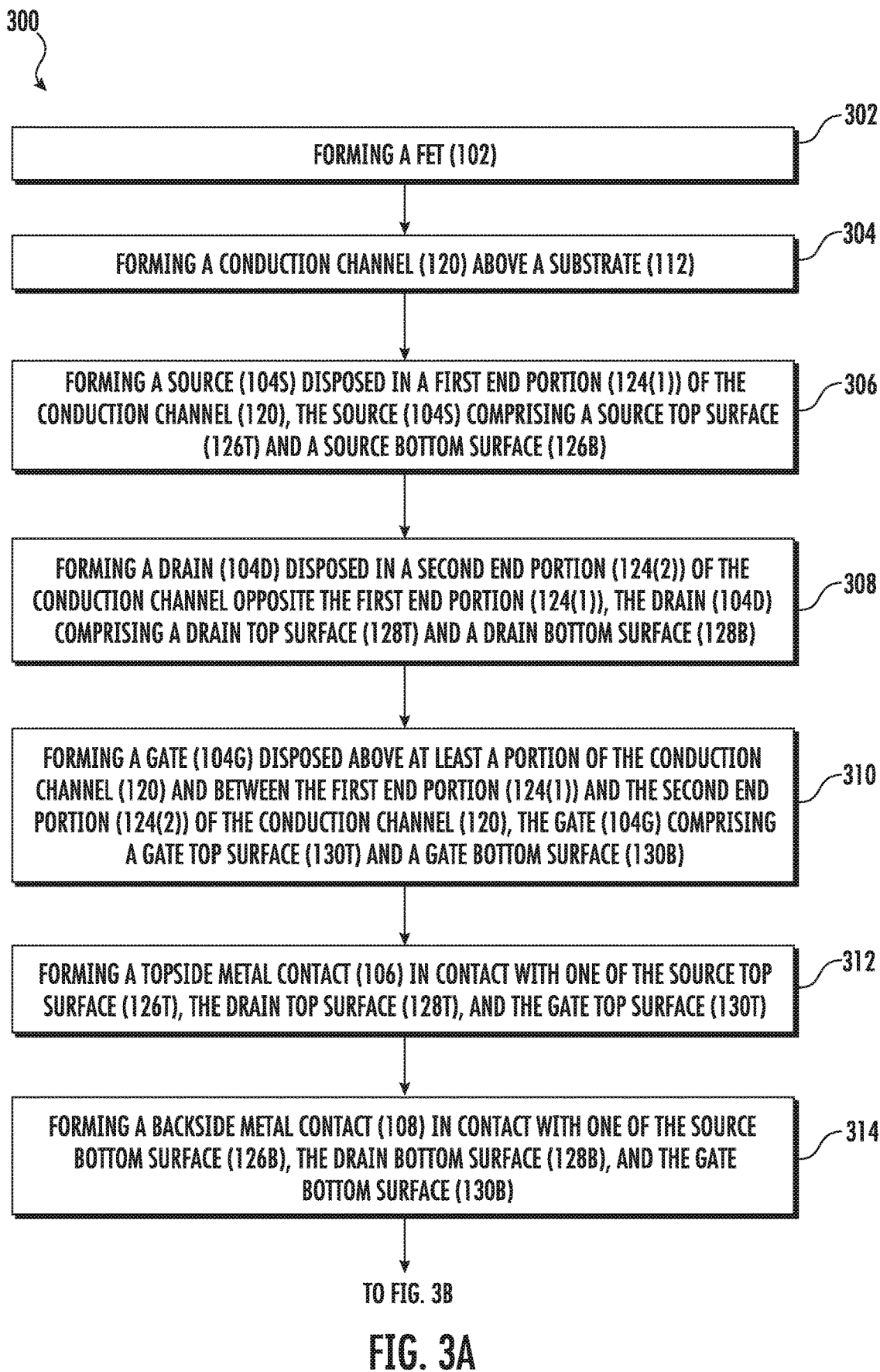
FIGS. 3A and 3B are a flowchart illustrating an exemplary process of fabricating the FET in the FET circuit in FIGS. 1A and 1B, and FIG. 2.
Figure 3B:
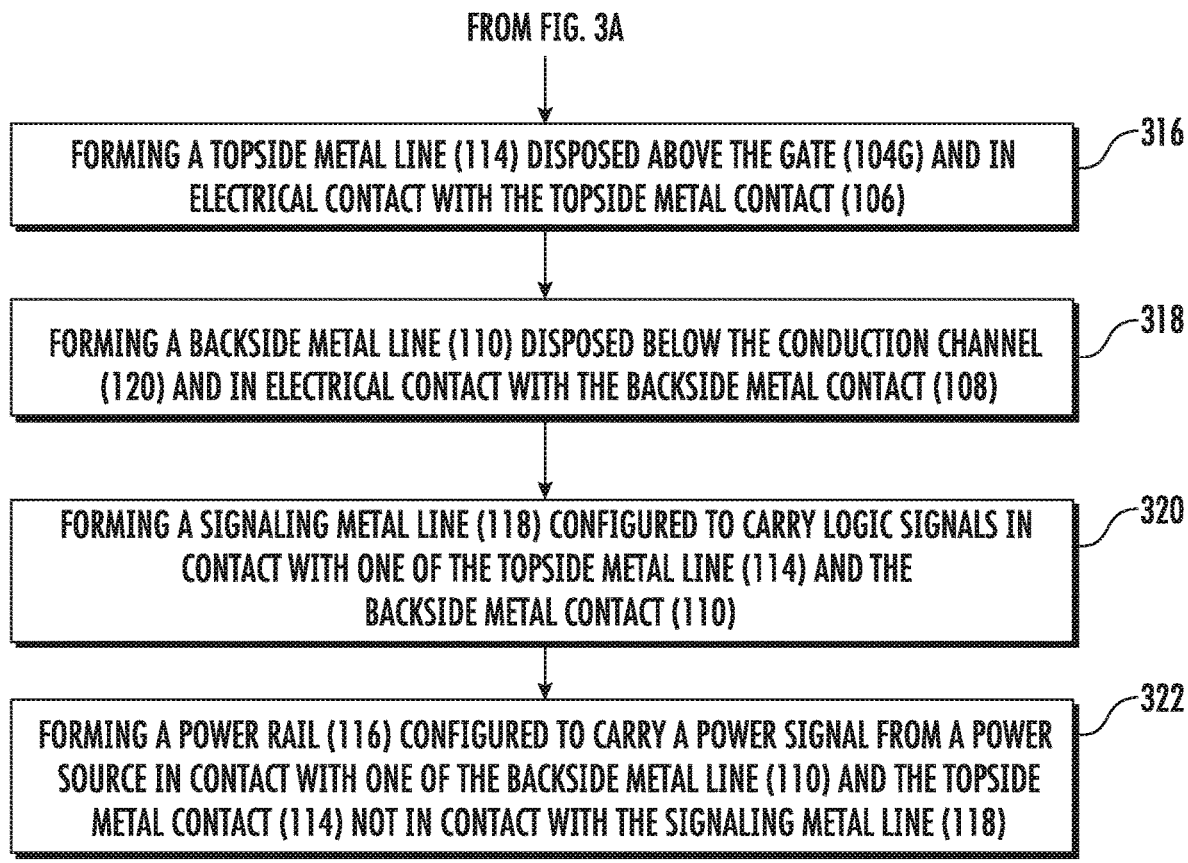

An exemplary process 300 for forming the FET circuits 100, 203 in FIGS. 1A-2 is provided in FIGS. 3A and 3B. The process 300 is described in reference to the FET circuit 100 in FIGS. 1A-1B, but is also applicable to the FET circuit 203 in FIG. 2 and its PFET 208P and NFET 208N. In this regard, the process 300 includes forming a FET 102 (block 302 in FIG. 3A). Forming the FET 102 includes forming a conduction channel 120 above a substrate 112 (block 304 in FIG. 3A). Forming the FET 102 also includes forming a source 104S disposed in a first end portion 124(1) of the conduction channel 120, the source 104 comprising a source top surface 126T and a source bottom surface 126B (block 306 in FIG. 3A). Forming the FET 102 also includes forming a drain 104D disposed in a second end portion 124(2) of the conduction channel 120 opposite the first end portion 124(1), the drain 104D comprising a drain top surface 128T and a drain bottom surface 128B (block 308 in FIG. 3A). Forming the FET 102 also includes forming a gate 104G disposed above at least a portion of the conduction channel 120 and between the first end portion 124(1) and the second end portion 124(2) of the conduction channel 120, the gate 104G comprising a gate top surface 130T and a gate bottom surface 130B (block 310 in FIG. 3A).

With continuing reference to FIGS. 3A and 3B, forming the FET circuit 100 also includes forming a topside metal contact 106 in contact with one of the source top surface 126T, the drain top surface 128T, and the gate top surface 130T (block 312 in FIG. 3A). Forming the FET circuit 100 also includes forming a backside metal contact 108 in contact with one of the source bottom surface 126B, the drain bottom surface 128B, and the gate bottom surface 130B (block 314 in FIG. 3A). Forming the FET circuit 100 also includes forming a topside metal line 114 disposed above the gate 104G and in electrical contact with the topside metal contact 106 (block 316 in FIG. 3B). Forming the FET circuit 100 also includes forming a backside metal line 110 disposed below the conduction channel 120 and in electrical contact with the backside metal contact 108 (block 318 in FIG. 3B). Forming the FET circuit 100 also includes forming a signaling metal line 118 configured to carry logic signals in contact with one of the topside metal line 114 and the backside metal line 110 (block 320 in FIG. 3B). Forming the FET circuit 100 also includes forming a power rail 116 configured to carry a power signal from a power source in contact with one of the backside metal line 110 and the topside metal line 114 not in contact with the signaling metal line 118 (block 322 in FIG. 3B).

Figure 4A:
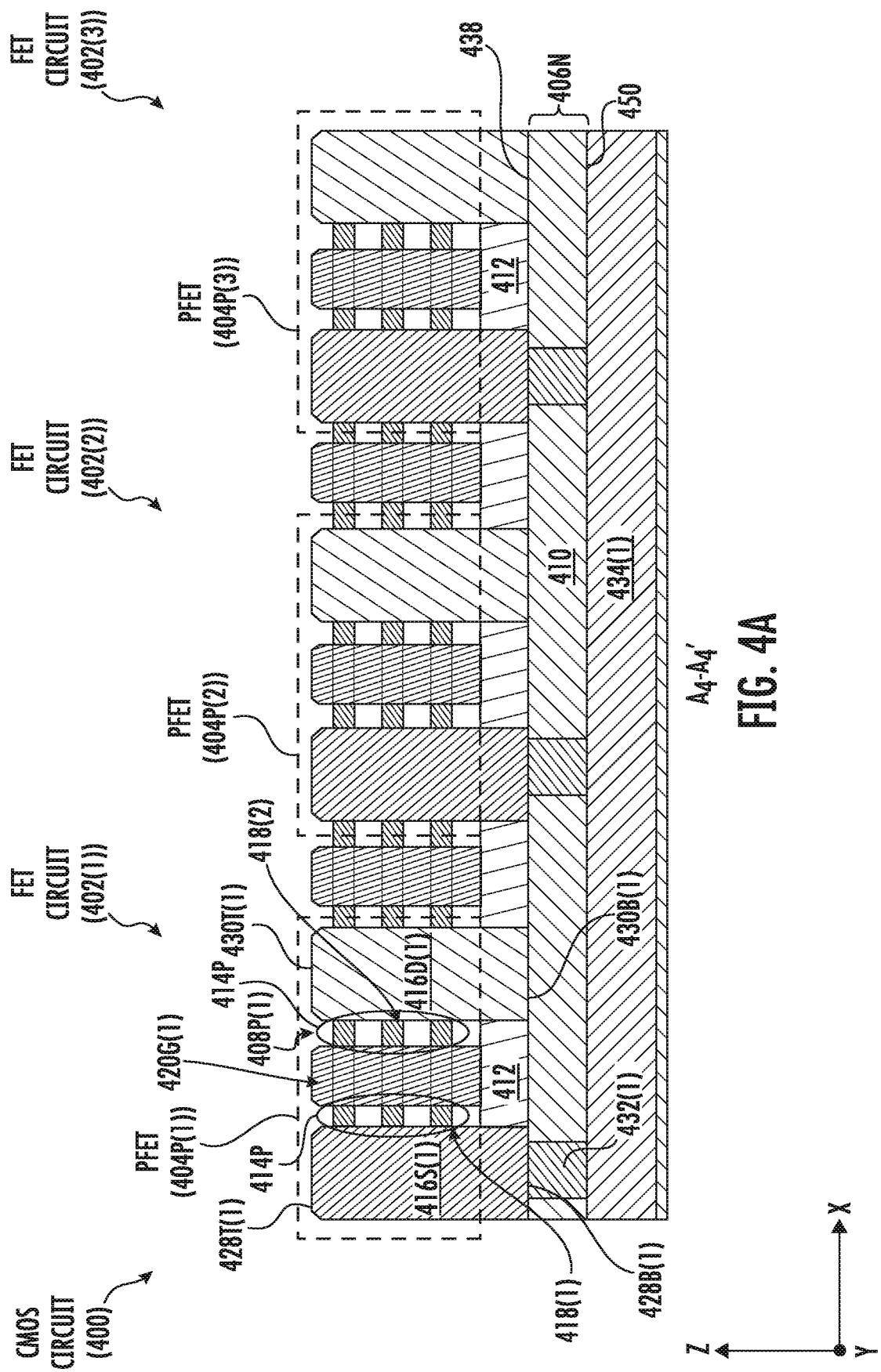
Figure 4C:
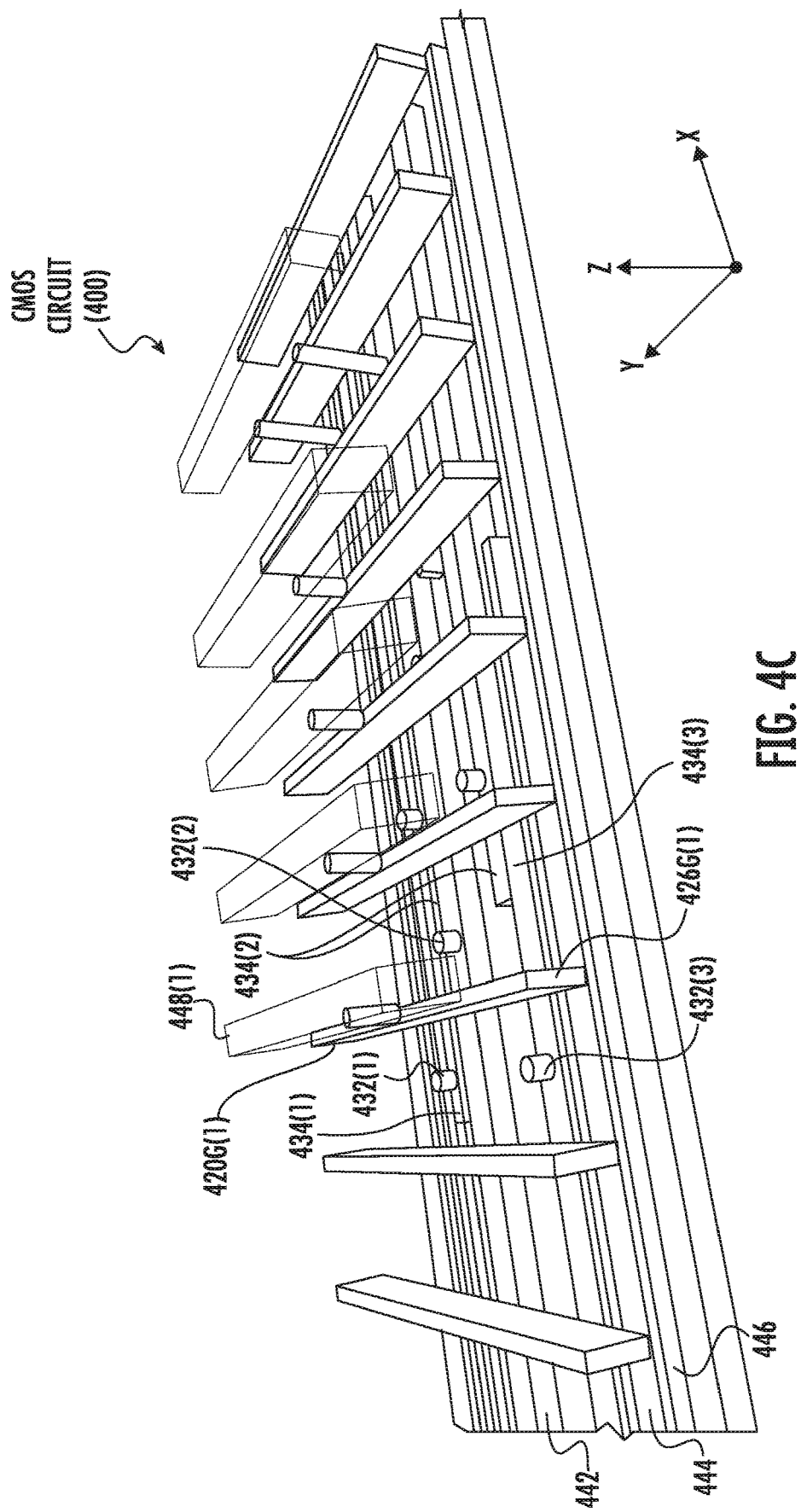
FIGS. 4C and 4D illustrate respective top and bottom perspective views of the FET circuits in FIGS. 4A and 4B.
Figure 4D:
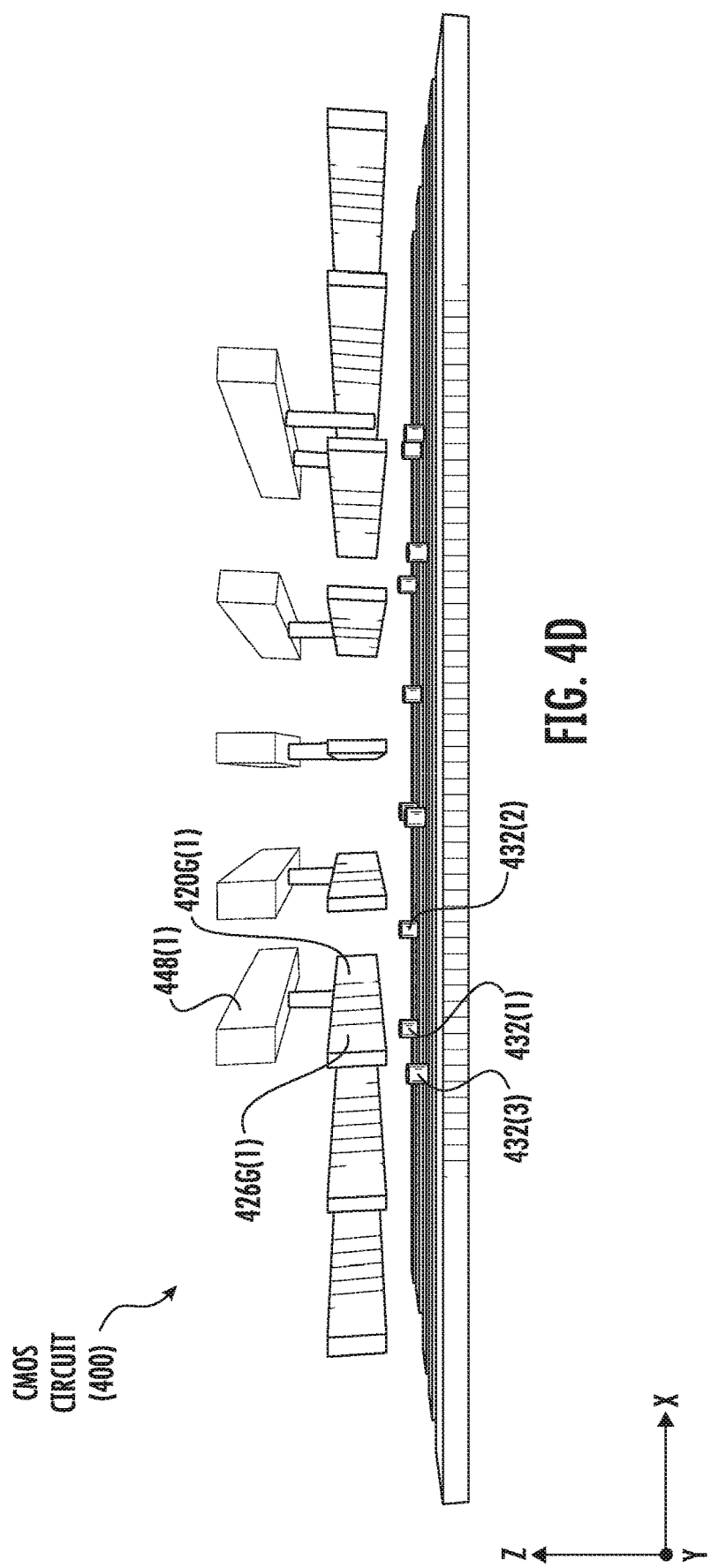

Different variations of CMOS circuits that include backside and/or topside power and/or signal routing are possible. For example, FIGS. 4A and 4B illustrate respective cross-sectional side and bottom views of another exemplary CMOS circuit 400 that includes FET circuits 402(1)-402(3) that include respective PFETs 404P(1)-404P(3) formed in an N-type diffusion region 406N and NFETs 404N(1)-404N(3) formed in a P-type diffusion region 406P (as shown in FIG. 4B) that have a shared drain and employ backside routing for source and drain connections. FIG. 4A is a cross-sectional side view of the CMOS circuit 400 in FIG. 4B along the $A_4$-$A_4'$ cross-section line. The FET circuit 402(1) that includes the PFET 404P(1) and NFET 404N(1) will now be discussed as an example, but this example also is applicable to the FET circuits 402(2) and 402(3). The PFET 404P(1) and NFET 404N(1) are GAA FETs in this example, but note that the PFET 404P(1) and NFET 404N(1) could be a planar FET or FinFET as other non-limiting examples. The PFET 404P(1) includes a P-type conduction channel 408P(1), and the NFET 404N(1) includes an N-type conduction channel 408N(1), which are both disposed above a substrate 410 in the Z-axis direction as shown in FIG. 4A. In this example, the PFET 404P(1) and NFET 404N(1) are semiconductor-on-insulator (SOI) FETs that are disposed on a buried oxide (BOX) layer 412 that is disposed on the substrate 410. The P-type conduction channel 408P(1) and N-type conduction channel 408N(1) are made out of plurality of respective nanostructures 414P, 414N (e.g., nanowires or nanoslabs) made from a semiconductor material to be able to conduct current in response to an electric field. In semiconductor manufacturing, an SOI FET is a FET that is fabricated as a semiconductor device in a layered silicon-insulator-silicon substrate, to reduce parasitic capacitance within the device, thereby improving performance. SOI-based devices differ from conventional silicon-built devices in that the silicon junction is above an electrical insulator, which may be silicon dioxide or sapphire. The choice of insulator depends largely on the intended application. The BOX layer 412 is an oxide layer in an SOI substrate, such as $SiO_2$, buried in a silicon wafer.

With continuing reference to FIGS. 4A and 4B, the PFET 404P(1) in the FET circuit 402(1) includes a P-type source 416S(1) that is disposed in and extends through the BOX layer 412 in the N-type diffusion region 406N in a first end portion 418(1) of the P-type conduction channel 408P(1). The PFET 404P(1) also includes a P-type drain 416D(1) that is disposed in and extends through the BOX layer 412 in the N-type diffusion region 406N on a second end portion 418(2) of the P-type conduction channel 408P(1) opposite the first end portion 418(1) in the X-axis direction. For example, the P-type source 416S(1) and P-type drain 416D(1) may have been epitaxially grown on the substrate 410 or formed by an implant into the substrate 410. The PFET 404P(1) also includes a gate 420G(1) that is disposed on the BOX layer 412 and above at least a portion of the P-type conduction channel 408P(1) between the first end portion 418(1) and the second end portion 418(2) of the P-type conduction channel 408P(1). In this example, the gate 420G(1) is comprised of a gate material that surrounds each of the nanostructures 414P of the P-type conduction channel 408P(1). In this manner, a voltage applied between the gate 420G(1) and the P-type source 416S(1) of the PFET 404P(1) can create an electric field in the P-type conduction channel 408P(1) sufficient to cause the nanostructures 414P of the P-type conduction channel 408P(1) to conduct current between the P-type source 416S(1) and the P-type drain 416D(1).

As shown in the bottom view of the CMOS circuit 400 in FIG. 4B, the NFET 404N(1) in the FET circuit 402(1) includes an N-type source 422S(1) that is disposed in and extends through the BOX layer 412 in the P-type diffusion region 406P in a first end portion 424(1) of the N-type conduction channel 408N(1). The NFET 404N(1) also includes an N-type drain 422D(1) that is disposed in and extends through the BOX layer 412 in the P-type diffusion region 406P in a second end portion 424(2) of the N-type conduction channel 408N(1) opposite the first end portion 424(1) in the X-axis direction. For example, the N-type source 422S(1) and N-type drain 422D(1) may have been epitaxially grown on the substrate 410 or formed by an implant into the substrate 410. In this example, the drains 416D(1), 422D(1) of the respective PFET 404P(1) and NFET 404N(1) are coupled together. The NFET 404N(1) also includes a gate 426G(1) that is disposed on the BOX layer 412 and above at least a portion of the N-type conduction channel 408N(1) between the first end portion 424(1) and the second end portion 424(2) of the N-type conduction channel 408N(1). In this example, the gate 426G(1) is comprised of a gate material that surrounds each of the nanostructures 414N of the N-type conduction channel 408N(1). In this manner, a voltage applied between the gate 426G(1) and the N-type source 422S(1) of the NFET 404N(1) can create an electric field in the N-type conduction channel 408N(1) sufficient to cause the nanostructures 414N of the N-type conduction channel 408N(1) to conduct current between the N-type source 422S(1) and the N-type drain 422D(1).

With continuing reference to FIGS. 4A and 4B, in this example, the P-type source 416S(1) of the PFET 404P has a source top surface 428T(1) and a source bottom surface 428B(1), and the P-type drain 416D(1) has a drain top surface 430T(1) and a drain bottom surface 430B(l). The source bottom surface 428B(1) and drain bottom surface 430B(1) are in contact with a top surface 438 of the substrate 410 as shown in FIG. 4A. In this example, a backside metal contact 432(1) is in contact with the source bottom surface 428B(1) of the P-type source 416S(1) of the PFET 404P(1) to provide connectivity between the P-type source 416S(1) and a backside metal line 434(1) adjacent to the N-type diffusion region 406N as shown in FIG. 4B. The backside metal contact 432(1) is also in contact with the top surface 438 of the substrate 410 as shown in FIG. 4A. The backside metal line 434(1) extends along a longitudinal axis $LA_1$ in the X-axis direction. The backside metal line 434(1) is disposed below a bottom surface 450 of the substrate 410 of the CMOS circuit 400 in the Z-axis direction as shown in FIG. 4A in this example. For example, the backside metal contact 432(1) may be a conductive pillar or via that connects the source bottom surface 428B(1) to the backside metal line 434(1). For example, the backside metal contact 432(1) may be a TSV or other via that is of sufficiently small diameter to connect the source bottom surface 428B(1) to the backside metal line 434(1) without disturbing adjacent routing areas. The backside metal line 434(1) can be a power rail, such as a positive power rail configured to carry a power signal, or can be coupled to a power rail 442 as shown in another top perspective view of the CMOS circuit 400 in FIG. 4C, to carry a power signal, as examples. In this manner, the power signal can be routed and coupled to the P-type source 416S(1) of the PFET 404P(1) from the backside of the substrate 410 in this example.

Also, in this example, a backside metal contact 432(2) is in contact with the drain bottom surface 430B(1) of the P-type drain 416D(1) of the PFET 404P(1) to provide connectivity between the P-type drain 416D(1) and a backside metal line 434(2) as shown in FIG. 4B. The backside metal contact 432(2) is also in contact with the top surface 438 of the substrate 410. The backside metal line 434(2) extends along a longitudinal axis $LA_2$ in the X-axis direction that is parallel to the longitudinal axis $LA_1$ of the backside metal line 434(1). The backside metal line 434(2) is disposed below the bottom surface 450 of the substrate 410 of the CMOS circuit 400 in the Z-axis direction as shown in FIG. 4A. For example, the backside metal contact 432(2) may be a conductive pillar or via that connects the drain bottom surface 430B(1) to the backside metal line 434(2). For example, the backside metal contact 432(2) may be a TSV or other via that is of sufficiently small diameter to connect the drain bottom surface 430B(1) to the backside metal line 434(2) without disturbing adjacent routing areas. The backside metal line 434(2) can be a signaling metal line to carry a logic signal to or from another circuit, or can be coupled to a signaling metal line 446 as shown in another top perspective view of the CMOS circuit 400 in FIG. 4C, to carry a logic signal, as examples. In this manner, a logic signal can be routed and coupled to the P-type drain 416D(1) of the PFET 404P(1) from the backside of the substrate 410 in this example.

With continuing reference to FIGS. 4A and 4B, in this example, the N-type source 422S(1) of the NFET 404N has a source bottom surface 436B(1), and the N-type drain 422D(1) has a drain bottom surface 440B(1). The source bottom surface 436B(1) and the drain bottom surface 440B (1) are in contact with the top surface 438 of the substrate 410 as shown in FIG. 4A. In this example, a backside metal contact 432(3) is in contact with the source bottom surface 436B(1) of the N-type source 422S(1) of the NFET 404N(1) to provide connectivity between the N-type source 422S(1) and a backside metal line 434(3) adjacent to the P-type diffusion region 406P as shown in FIG. 4B. The backside metal contact 432(3) is also in contact with the top surface 438 of the substrate 410. The backside metal line 434(3) extends along a longitudinal axis $LA_3$ in the X-axis direction that is parallel to the longitudinal axes $LA_1$, $LA_2$ of the backside metal lines 434(1), 434(2). In this example, the backside metal line 434(3) is provided such that the backside metal line 434(2) is disposed between the backside metal line 434(1) and backside metal line 434(3) in the Y-axis direction in this example. The backside metal line 434(3) is disposed below the bottom surface 450 of the substrate 410 of the CMOS circuit 400 in the Z-axis direction as shown in FIG. 4A. For example, the backside metal contact 432(3) may be a conductive pillar or via that connects the source bottom surface 436B(1) to the backside metal line 434(3). For example, the backside metal contact 432(1) may be a TSV or other via that is of sufficiently small diameter to connect the source bottom surface 436B(1) to the backside metal line 434(3) without disturbing adjacent routing areas. The backside metal line 434(3) can be a second power rail, such as a negative power rail or ground, or coupled to a second power rail 444 as shown in another top perspective view of the CMOS circuit 400 in FIG. 4C, as examples.

Also, in this example, the backside metal contact 432(2) is in contact with the drain bottom surface 440B(1) of the N-type drain 422D(1) of the NFET 404N(1) to provide connectivity between the N-type drain 422D(1) and the backside metal line 434(2) as shown in FIG. 4B. As discussed above, the P-type drain 416D(1) of the PFET 404P(1) and the N-type drain 422D(1) of the NFET 404N(1) are coupled together in this example.

Note that although the PFET 404P(1) and NFET 404N(1) in FIGS. 4A and 4B show their sources 416S(1), 422S(1) connected to the backside metal lines 434(1), 434(3) for backside routing, and their drains 416D(1), 422D(1) connected to the backside metal line 434(2) for backside routing, such is not limiting. As another example, the sources 416S(1) and/or 422S(1) could be connected to a topside metal line 448(1) as shown in the side perspective view of the CMOS circuit 400 in FIG. 4D for additional or only topside routing. The same is the case for the drains 416D(1) and/or 422D(1) of the PFET 404P(1) and NFET 404N(1). Further, the sources 416S(1), 422S(1) and/or the drains 416D(1), 422D(1) of the PFET 404P(1) and NFET 404N(1) could be connected by both topside and backside routing if desired, for signal and/or power routing. Further, the gates 420G(1), 426G(1) of the PFET 404P(1) and NFET 404N(1) could be also connected to a backside metal contact and/or a topside metal contact to provide gate connectivity to a topside and/or a backside metal line for signal and/or power routing. Also note that the FET circuits 402(2) and 402(3) shown in FIGS. 4A and 4B may also include backside and/or topside routing like the FET circuit 402(1).

Thus, in this manner, the backside routing to the FET circuit 402(1) in FIGS. 4A-4D provides additional area for signal and/or power routing to the PFET 404P(1) and NFET 404N(1) that may be advantageously employed to offset any reduction in routing area in the CMOS circuit 400, such as due to reduction of FET node size and/or the increased complexity of circuits that include the CMOS circuit 400. Also, the backside routing may be compatible with existing fabrication methods that provide for fabrication of the CMOS circuit 400 since additional topside routing may not be required.

Figure 5A:
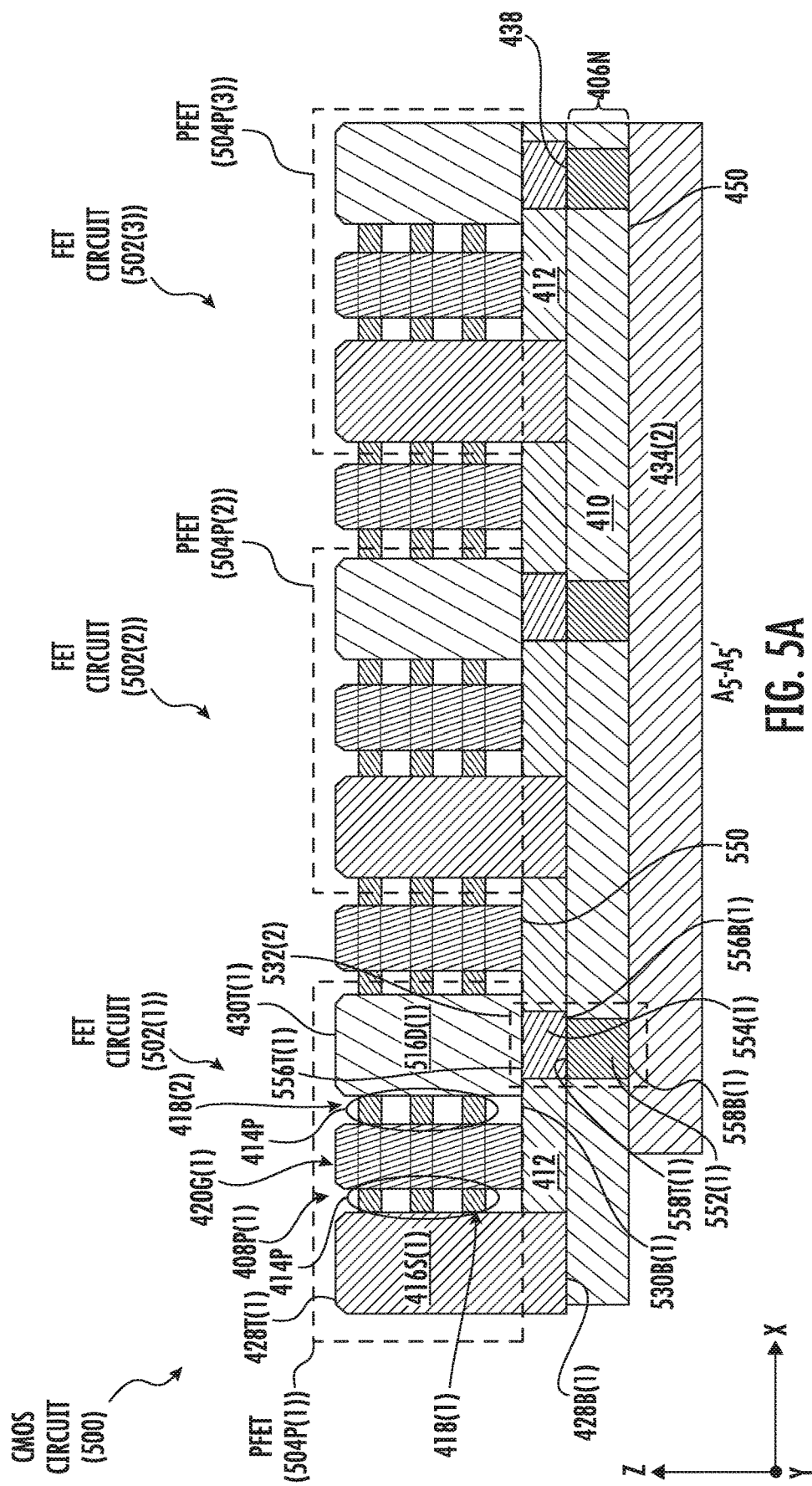
FIGS. 5A and 5B illustrate respective cross-sectional side and bottom views of an exemplary CMOS circuit that includes FET circuits that include a semiconductor-on-insulator (SOI) PFET and NFET, wherein the FET circuits include the PFET and the NFET that each includes source backside metal contacts in contact with bottom surfaces of their respective sources extended through a BOX layer and electrically coupled to a respective power metal line, and wherein the FET circuits also include a common drain backside metal contact line electrically coupled to a signaling metal line and electrically coupled with a bottom surface of respective drains of the PFET and NFET.
Figure 5B:
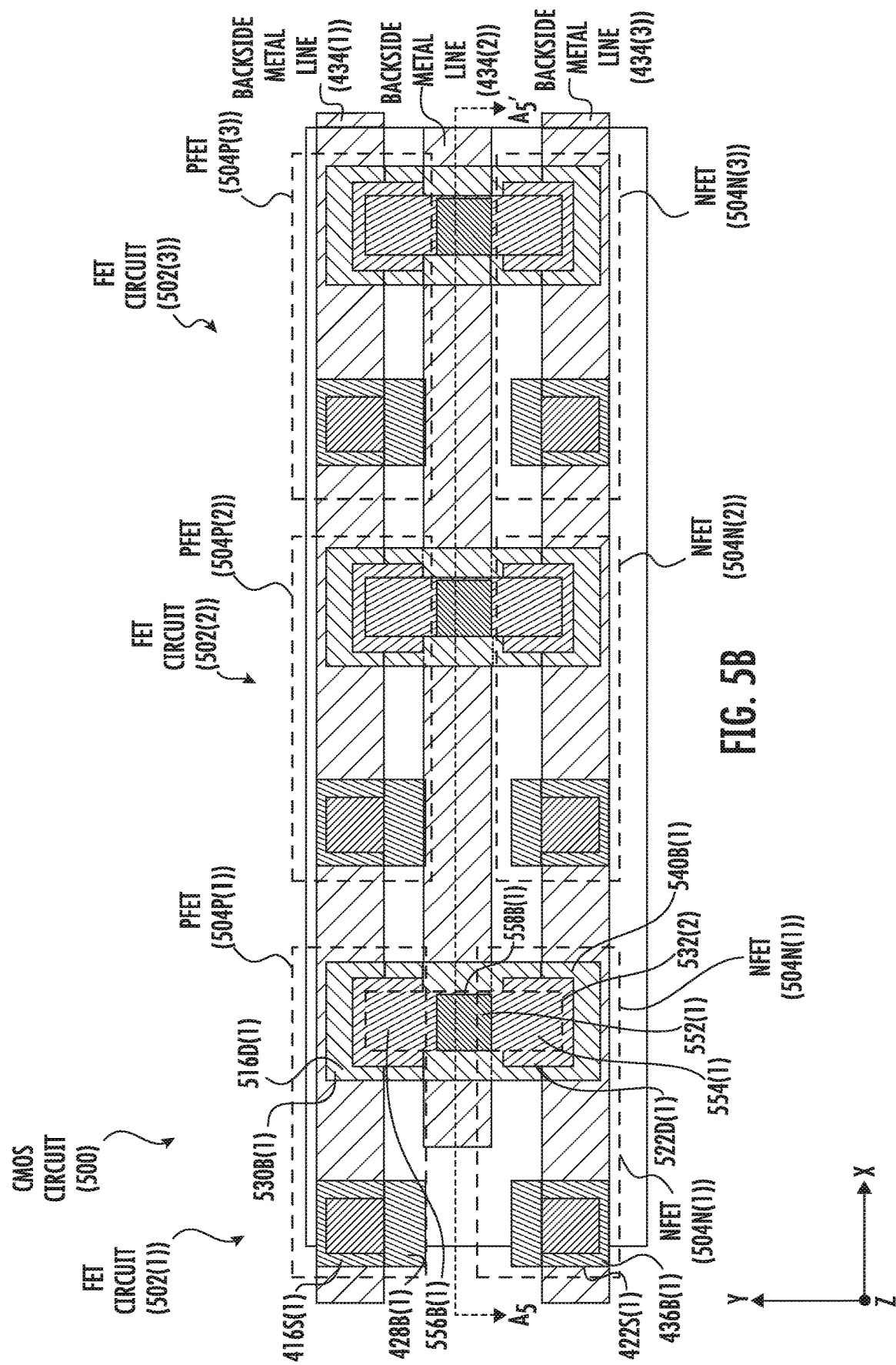

FIGS. 5A and 5B illustrate respective cross-sectional side and bottom views of another exemplary CMOS circuit 500 that includes FET circuits 502(1)-502(3) that include respective the PFETs 504P(1)-504P(3) formed in the N-type diffusion region 406N and NFETs 504N(1)-504N(3) formed in the P-type diffusion region 406P similar to the PFETs 404P(1)-404P(3) and NFETs 404N(1)-404N(3) in the FET circuits 402(1)-402(3) in FIGS. 4A and 4B. FIG. 5A is a cross-sectional side view of the CMOS circuit 500 in FIG. 5B along the $A_5$-$A_5'$ cross-section line. Common elements between the CMOS circuit 400 in FIGS. 4A and 4B and the CMOS circuit 500 in FIGS. 5A and 5B are shown with the same element numbers, and their discussion in FIGS. 4A-4D is applicable to FIGS. 5A and 5B. However, in the FET circuit 502(1) in FIGS. 5A and 5B, respective drains 516D(1), 522D(1) of the PFET 504P(1) and NFET 504N(1) do not extend into the BOX layer 412, but rather extend to a top surface 550 of the BOX layer 412. As will be discussed below, the backside metal contacts for the drains 516D(1), 522D(1) of the PFET 504P(1) and NFET 504N(1) include a first backside metal contact 554(1) that extends below both the drains 516D(1) and 522D(1) in the Z-axis direction as shown in FIG. 5A with a via 552(1) connecting the first backside metal contact 554(1) to the backside metal line 434(2) for backside routing to the drains 516D(1) and 522D(1).

As shown in FIG. 5B, in this example, a backside metal contact 532(2) is in contact with a drain bottom surface 530B(1) of the P-type drain 516D(1) of the PFET 504P(1) and a drain bottom surface 540B(1) of the N-type drain 522D(1) of the NFET 504N(1) to provide connectivity between the P-type drain 516D(1) and the N-type drain 522D(1) and the backside metal line 434(2) as shown in FIG. 5B. In this example, the backside metal contact 532(2) is comprised of the first backside metal contact 554(1) that is connected to the via 552(1) that is connected to the backside metal line 434(2). The first backside metal contact 554(1) provides a metal contact to provide connectivity to the shared P-type drain 516D(1) and N-type drain 522D(1). A first backside metal contact top surface 556T(1) of the first backside metal contact 554(1) is in contact with the drain bottom surfaces 530B(1), 540B(1) of the drains 516D(1), 522D(1). A first backside metal contact bottom surface 556B(1) of the first backside metal contact 554(1) is in contact with a top surface 558T(1) of the via 552(1). A bottom surface 558B(1) of the via 552(1) is in contact with the backside metal line 434(2). The via 552(1) may be a TSV or other via that is of sufficiently small diameter to connect the first backside metal contact 554(1) to the backside metal line 434(2) without disturbing adjacent routing areas.

Figure 6A:
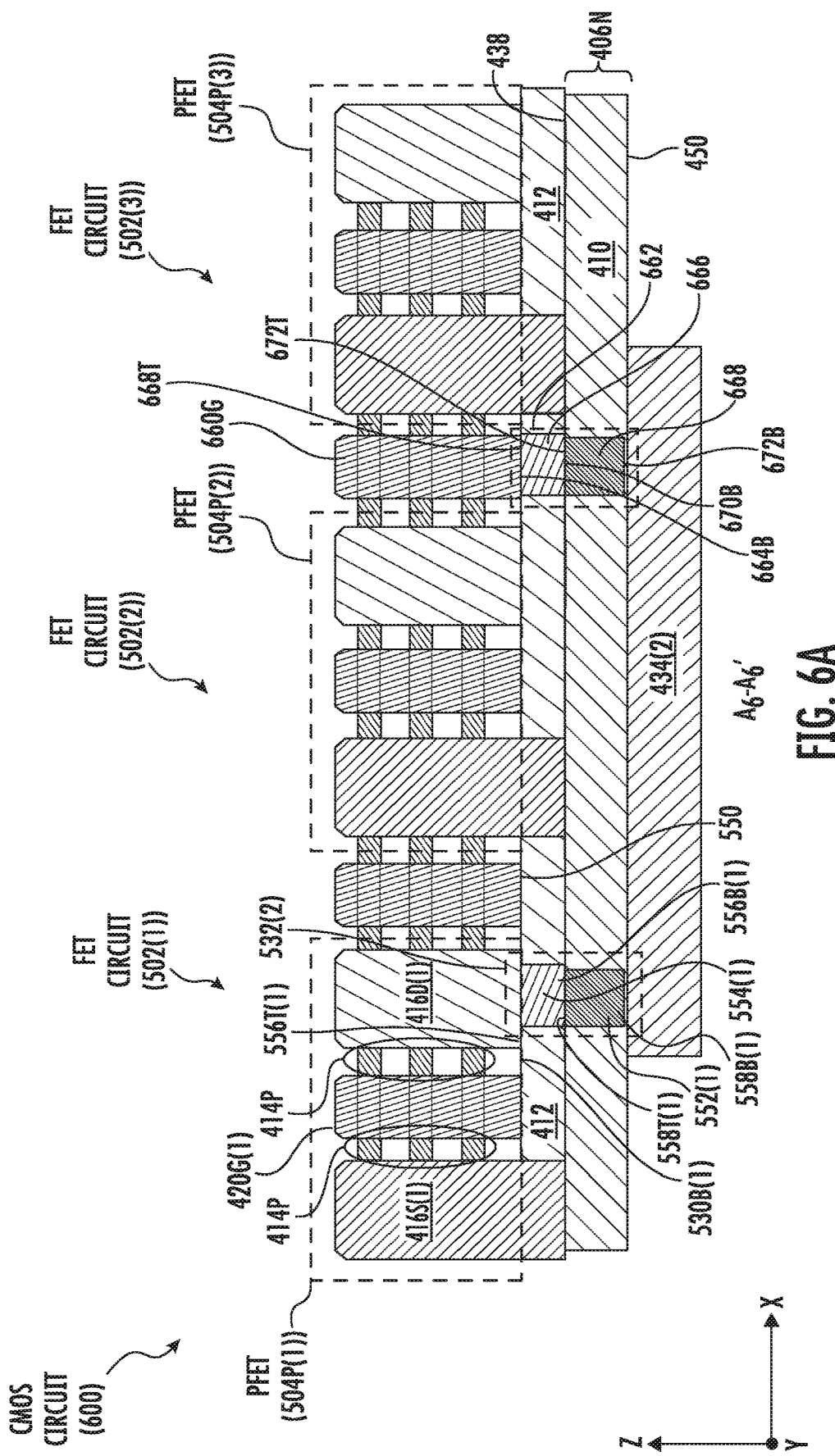
FIGS. 6A and 6B illustrate respective cross-sectional side and bottom views of an exemplary CMOS circuit that includes FET circuits that include a semiconductor-on-insulator (SOI) PFET and NFET, wherein the FET circuits include the PFET and the NFET that each includes source backside metal contacts in contact with bottom surfaces of their respective sources extended through a BOX layer and electrically coupled to a respective power metal line, and wherein the FET circuits also include a common drain backside metal contact line electrically coupled to a signaling metal line and electrically coupled with a bottom surface of respective drains of the PFET and NFET, and wherein a FET circuit also includes a gate backside metal contact electrically coupled with a bottom surface of a gate and electrically coupled to a backside metal contact line.
Figure 6B:
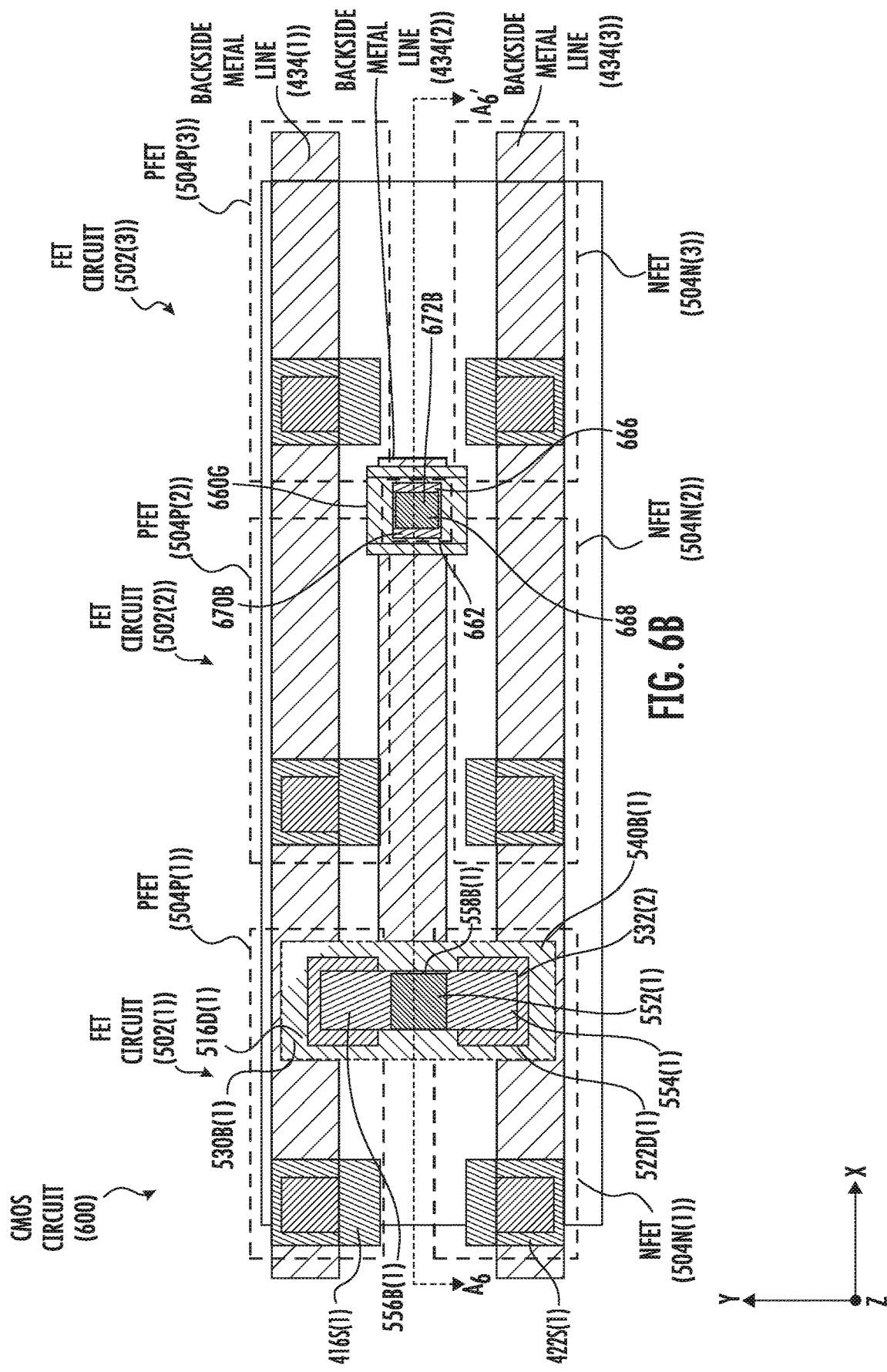

FIGS. 6A and 6B illustrate respective cross-sectional side and bottom views of another exemplary CMOS circuit 600 that includes the FET circuits 502(1)-502(3) that include respective the PFETs 504P(1)-504P(3) formed in the N-type diffusion region 406N and NFETs 504N(1)-504N(3) formed in the P-diffusion region 406P similar to FIGS. 5A and 5B. FIG. 6A is a cross-sectional side view of the CMOS circuit 600 in FIG. 6B along the $A_6$-$A_6'$ cross-section line. Common elements between the CMOS circuit 500 in FIGS. 5A and 5B, and the CMOS circuit 600 in FIGS. 6A and 6B are shown with the same element numbers. However, as shown in FIGS. 6A and 6B, a gate 660G is also connected to the backside metal line 434(2) that is also connected to the respective drains 516D(1), 522D(1) of the PFET 504P(1) and NFET 504N(1). The gate 660G does not extend into the BOX layer 412, but rather extends to the top surface 550 of the BOX layer 412.

As shown in FIGS. 6A and 6B, in this example, a backside metal contact 662 is in contact with a gate bottom surface 664B of the gate 660G. In this example, the backside metal contact 662 is comprised of a first backside metal contact 666 that is connected to a via 668 that is connected to the backside metal line 434(2). The first backside metal contact 666 is provided as part of the backside metal contact 662 to provide a metal contact to provide connectivity to the gate 660G. A first backside metal contact top surface 668T of the first backside metal contact 666 is in contact with the gate bottom surface 664B of the gate 660G. A first backside metal contact bottom surface 670B of the first backside metal contact 666 is in contact with a via top surface 672T of the via 668 as shown in FIG. 6A. A via bottom surface 672B of the via 668 is in contact with the backside metal line 434(2). The via 668 may be a TSV or other via that is of sufficiently small diameter to connect the first backside metal contact 666 to the backside metal line 434(2) without disturbing adjacent routing areas. The discussion of back side metal contacts and vias above with regard to FIGS. 1A-1B and 4A-5B are also applicable to the first backside metal contact 666 and via 668 in FIGS. 6A-6B.

It is noted that the terms "top" and "bottom" where used herein are relative terms and are not meant to limit or imply a strict orientation that a "top" referenced element must always be oriented to be above a "bottom" referenced element, and vice versa.

FETs employing backside contacts for backside routing of power and/or logic signals to the FETs, including but not limited to the FETs in FIGS. 1A-1B, 2, 4A-4D, 5A-5B, and 6A-6B, and wherein the FETs may be included in CMOS circuits that include backside contacts for backside routing of power and logic signals to the FETs, including but not limited to the CMOS circuits in FIGS. 2, 4A-4D, 5A-5B, and 6A-6B, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
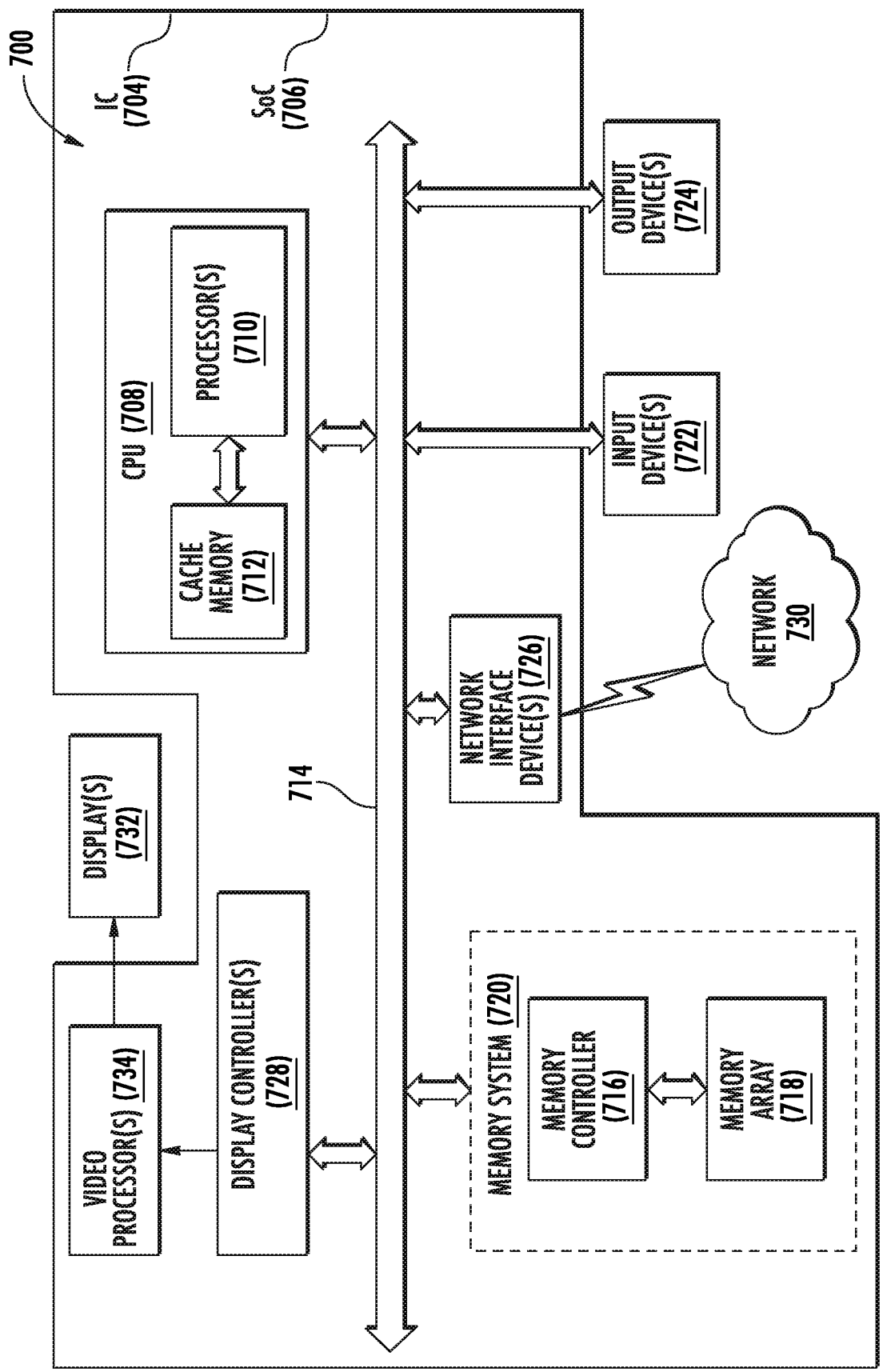
FIG. 7 is a block diagram of an exemplary processor-based system that can include FETs employing backside contacts for backside routing of power and/or logic signals to the FETs, including but not limited to the FETs in FIGS. 1A-1B, 2, 4A-4D, 5A-5B, and 6A-6B, and wherein the FETs may be included in CMOS circuits that include backside contacts for backside routing of power and logic signals to the FETs, including but not limited to the CMOS circuits in FIGS. 2, 4A-4D, 5A-5B, and 6A-6B.

In this regard, FIG. 7 illustrates an example of a processor-based system 700 that includes FETs employing backside contacts for backside routing of power and/or logic signals to the FETs, including but not limited to the FETs in FIGS. 1A-1B, 2, 4A-4D, 5A-5B, and 6A-6B, and wherein the FETs may be included in CMOS circuits that include backside contacts for backside routing of power and logic signals to the FETs, including but not limited to the CMOS circuits in FIGS. 2, 4A-4D, 5A-5B, and 6A-6B and according to any aspects disclosed herein in various components of the system. In this example, the processor-based system 700 may be formed as an IC 704 as a system-on-a-chip (SoC) 706. The processor-based system 700 includes a CPU 708 that includes one or more processors 710, which may also be referred to as CPU cores or processor cores. The CPU 708 may have a cache memory 712 coupled to the CPU 708 for rapid access to temporarily stored data. The CPU 708 is coupled to a system bus 714 that can intercouple master and slave devices included in the processor-based system 700. As is well known, the CPU 708 communicates with these other devices by exchanging address, control, and data information over the system bus 714. For example, the CPU 708 can communicate bus transaction requests to a memory controller 716 as an example of a slave device. Although not illustrated in FIG. 7, multiple system buses 714 could be provided, wherein each system bus 714 constitutes a different fabric.

Other master and slave devices can be connected to the system bus 714. As illustrated in FIG. 7, these devices can include a memory system 720 that includes the memory controller 716 and a memory array(s) 718, one or more input devices 722, one or more output devices 724, one or more network interface devices 726, and one or more display controllers 728, as examples. Each of the memory system 720, the one or more input devices 722, the one or more output devices 724, the one or more network interface devices 726, and the one or more display controllers 728 can include the FETs. The input device(s) 722 can include any type of input device, including but not limited to input keys, switches, voice processors, etc. The output device(s) 724 can include any type of output device, including, but not limited to, audio, video, other visual indicators, etc. The network interface device(s) 726 can be any device configured to allow exchange of data to and from a network 730. The network 730 can be any type of network, including but not limited to a wired or wireless network, a private or public network, a local area network (LAN), a wireless local area network (WLAN), a wide area network (WAN), a BLUETOOTH™ network, and the Internet. The network interface device(s) 726 can be configured to support any type of communications protocol desired.

The CPU 708 may also be configured to access the display controller(s) 728 over the system bus 714 to control information sent to one or more displays 732. The display controller(s) 728 sends information to the display(s) 732 to be displayed via one or more video processors 734, which process the information to be displayed into a format suitable for the display(s) 732. The display(s) 732 can include any type of display, including, but not limited to, a cathode ray tube (CRT), a liquid crystal display (LCD), a plasma display, a light emitting diode (LED) display, etc.

Figure 8:
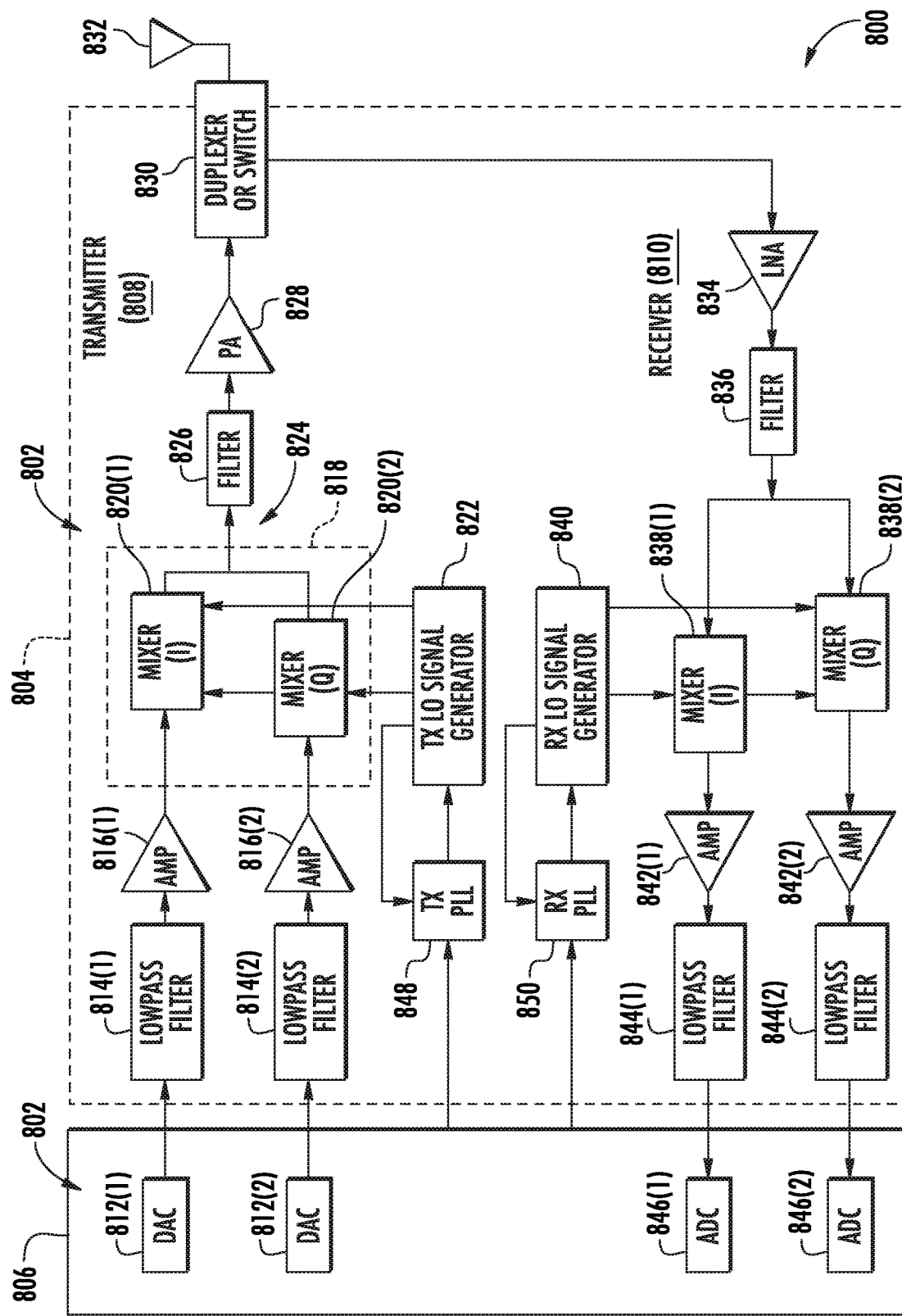
FIG. 8 is a block diagram of an exemplary wireless communications device that includes radio frequency (RF)

FIG. 8 illustrates an exemplary wireless communications device 800 that includes radio frequency (RF) components formed from one or more ICs 802, wherein any of the ICs 802 can include FETs employing backside contacts for backside routing of power and/or logic signals to the FETs, including but not limited to the FETs in FIGS. 1A-1B, 2, 4A-4D, 5A-5B, and 6A-6B, and wherein the FETs may be included in CMOS circuits that include backside contacts for backside routing of power and logic signals to the FETs, including but not limited to the CMOS circuits in FIGS. 2, 4A-4D, 5A-5B, and 6A-6B, and according to any aspects disclosed herein.

As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMP) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals from a TX LO signal generator 822 through mixers 820(1), 820(2) to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by amplifiers (AMP) 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A method of fabricating a field-effect transistor (FET) circuit, comprising:
   forming a FET, comprising:
      forming a conduction channel above a substrate;
      forming a source disposed in a first end portion of the conduction channel, the source comprising a source top surface and a source bottom surface;
      forming a drain disposed in a second end portion of the conduction channel opposite the first end portion, the drain comprising a drain top surface and a drain bottom surface; and
      forming a gate disposed above at least a portion of the conduction channel and between the first end portion and the second end portion of the conduction channel, the gate comprising a gate top surface and a gate bottom surface;

forming a topside metal contact in contact with one of the source top surface, the drain top surface, and the gate top surface;
forming a backside metal contact in contact with one of the source bottom surface, the drain bottom surface, and the gate bottom surface;
forming a topside metal line disposed above the gate and in electrical contact with the topside metal contact;
forming a backside metal line disposed below the conduction channel and in electrical contact with the backside metal contact;
forming a signaling metal line configured to carry logic signals in contact with one of the topside metal line and the backside metal line; and
forming a power rail configured to carry a power signal from a power source in contact with one of the backside metal line and the topside metal line not in contact with the signaling metal line.

2. The method of claim 1, wherein forming the backside metal contact comprises forming a vertical interconnect access (via) comprising a via top surface in contact with the one of the source bottom surface, the drain bottom surface, and the gate bottom surface.

3. The method of claim 1, further comprising:
forming the substrate comprising a substrate top surface and a substrate bottom surface; and
forming a buried oxide (BOX) layer on the substrate top surface;
wherein:
  forming the backside metal line further comprises forming the backside metal line below the substrate bottom surface;
  forming the source further comprises forming the source in contact with the BOX layer; and
  forming the drain further comprises forming the drain in contact with the BOX layer.

4. The method of claim 3, wherein forming the backside metal contact further comprises:
forming a backside metal contact top surface in contact with the one of the source bottom surface, the drain bottom surface, and the gate bottom surface, and a backside metal contact bottom surface; and
forming a vertical interconnect access (via) comprising a via top surface in contact with the backside metal contact bottom surface.

5. The method of claim 3, wherein forming the source further comprises forming the source to extend through the BOX layer such that the source bottom surface is in contact with the substrate top surface.

6. The method of claim 3, wherein forming the drain further comprises forming the drain to extend through the BOX layer such that the drain bottom surface is in contact with the substrate top surface.

7. A field-effect transistor (FET) circuit, comprising:
a signaling metal line configured to carry logic signals;
a power rail configured to carry a power signal from a power source;
a FET, comprising:
  a conduction channel disposed above a substrate;
  a source disposed in a first end portion of the conduction channel, the source comprising a source top surface and a source bottom surface;
  a drain disposed in a second end portion of the conduction channel opposite the first end portion, the drain comprising a drain top surface and a drain bottom surface; and
  a gate disposed above at least a portion of the conduction channel and between the first end portion and the second end portion of the conduction channel, the gate comprising a gate top surface and a gate bottom surface;
a topside metal contact in contact with one of the source top surface, the drain top surface, and the gate top surface;
a backside metal contact in contact with one of the source bottom surface, the drain bottom surface, and the gate bottom surface;
a topside metal line disposed above the gate, the topside metal line electrically coupled to the topside metal contact and one of the signaling metal line and the power rail; and
a backside metal line disposed below the conduction channel, the backside metal line electrically coupled to the backside metal contact and one of the power rail and the signaling metal line not coupled to the topside metal line.

8. The FET circuit of claim 7 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. The FET circuit of claim 7, wherein the backside metal contact comprises a vertical interconnect access (via) in contact with the one of the source bottom surface, the drain bottom surface, and the gate bottom surface.

10. The FET circuit of claim 7 integrated into a semiconductor die.

11. The FET circuit of claim 7, further comprising:
a second backside metal contact in contact with one of the of the source bottom surface, the drain bottom surface, and the gate bottom surface not in contact with the backside metal contact; and
a second backside metal line disposed below the conduction channel, the second backside metal line electrically coupled to the second backside metal contact and the signaling metal line.

12. The FET circuit of claim 11, wherein:
the conduction channel extends along a first longitudinal axis between the first end portion and the second end portion of the conduction channel;
the backside metal line extends along a second longitudinal axis parallel to the first longitudinal axis; and
the second backside metal line extends along a third longitudinal axis parallel to the second longitudinal axis.

13. The FET circuit of claim 11, wherein:
the backside metal contact is in contact with the drain bottom surface; and
the second backside metal contact is in contact with the source bottom surface.

14. The FET circuit of claim 11, wherein:
the backside metal contact is in contact with the source bottom surface; and the second backside metal contact is in contact with the drain bottom surface.

15. The FET circuit of claim 7, further comprising:
the substrate comprising a substrate top surface and a substrate bottom surface;
a buried oxide (BOX) layer disposed on the substrate top surface;
the backside metal line disposed below the substrate bottom surface;
the source disposed in contact with the BOX layer; and
the drain disposed in contact with the BOX layer.

16. The FET circuit of claim 15, wherein the backside metal contact comprises:
a backside metal contact top surface in contact with the one of the source bottom surface, the drain bottom surface, and the gate bottom surface, and a backside metal contact bottom surface; and
a vertical interconnect access (via) comprising a via top surface in contact with the backside metal contact bottom surface.

17. The FET circuit of claim 16, wherein:
the one of the source bottom surface, the drain bottom surface, and the gate bottom surface in contact with the backside metal contact top surface of the backside metal contact is in contact with a BOX layer top surface of the BOX layer.

18. The FET circuit of claim 16, wherein:
the backside metal contact is in contact with the BOX layer; and
the via is in contact with the substrate.

19. The FET circuit of claim 15, wherein at least one of:
the source extends through the BOX layer such that the source bottom surface is in contact with the substrate top surface; and
the drain extends through the BOX layer such that the drain bottom surface is in contact with the substrate top surface.

20. The FET circuit of claim 19, wherein:
the backside metal contact comprises a vertical interconnect access (via) comprising a via top surface in contact with the one of the source bottom surface and the drain bottom surface.

21. The FET circuit of claim 20, wherein the via is in contact with the substrate.

* * * * *